US010832907B2

(12) United States Patent
Cheng et al.

(10) Patent No.: US 10,832,907 B2
(45) Date of Patent: Nov. 10, 2020

(54) GATE-ALL-AROUND FIELD-EFFECT TRANSISTOR DEVICES HAVING SOURCE/DRAIN EXTENSION CONTACTS TO CHANNEL LAYERS FOR REDUCED PARASITIC RESISTANCE

(71) Applicant: International Business Machines Corporation, Armonk, NY (US)

(72) Inventors: Kangguo Cheng, Schenectady, NY (US); Yi Song, Albany, NY (US); Zhenxing Bi, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/276,738

(22) Filed: Feb. 15, 2019

(65) Prior Publication Data

US 2020/0266060 A1 Aug. 20, 2020

(51) Int. Cl.
*H01L 21/02* (2006.01)
*H01L 21/308* (2006.01)
(Continued)

(52) U.S. Cl.
CPC .. *H01L 21/02603* (2013.01); *H01L 21/02532* (2013.01); *H01L 21/3086* (2013.01);
(Continued)

(58) Field of Classification Search
CPC .......... H01L 21/2686; H01L 21/28194; H01L 29/517; H01L 29/66545; H01L 29/66628;
(Continued)

(56) References Cited

U.S. PATENT DOCUMENTS 9,362,355 B1* 6/2016 Cheng ............... H01L 29/66742
9,490,323 B2 11/2016 Rodder et al.
(Continued)

FOREIGN PATENT DOCUMENTS

KR 20180018426 A 2/2018
WO 2018134581 A1 7/2018

OTHER PUBLICATIONS

N. Loubet et al., "Stacked Nanosheet Gate-All-Around Transistor to Enable Scaling Beyond FinFET," Symposium on VLSI Technology, Jun. 5-8, 2017, 2 pages.

*Primary Examiner* — Duy T Nguyen
(74) *Attorney, Agent, or Firm* — Douglas Pearson; Ryan, Mason & Lewis, LLP

(57) ABSTRACT

Devices and methods are provided for fabricating field-effect transistors having source/drain extension contacts to provide reduced parasitic resistance in electrical paths between source/drain layers and active channel layers surrounded by gate structures of the field-effect transistor devices. For example, in a nanosheet field-effect transistor device having embedded gate sidewall spacers which are disposed between end portions of active nanosheet channel layers and serve to insulate source/drain layers from a metal gate structure, epitaxial source/drain extension contacts are disposed between the embedded gate sidewall spacers and active nanosheet channel layers, and on sidewall surfaces of the active nanosheet channel layers. Epitaxial source/drain layers are grown starting on exposed surfaces of the epitaxial source/drain extension contacts. The epitaxial source/drain extension contacts laterally extend from epitaxial source/drain layers to a high-k dielectric/metal gate structure that surrounds the active nanosheet channel layers.

19 Claims, 20 Drawing Sheets

(51) Int. Cl.
  *H01L 29/66* (2006.01)
  *H01L 29/78* (2006.01)
  *H01L 29/165* (2006.01)
  *H01L 29/06* (2006.01)
  *H01L 29/423* (2006.01)
  *H01L 29/08* (2006.01)

(52) U.S. Cl.
  CPC ...... *H01L 29/0673* (2013.01); *H01L 29/0847* (2013.01); *H01L 29/165* (2013.01); *H01L 29/42356* (2013.01); *H01L 29/6653* (2013.01); *H01L 29/66545* (2013.01); *H01L 29/66795* (2013.01); *H01L 29/7851* (2013.01); *H01L 2029/7858* (2013.01)

(58) Field of Classification Search
  CPC ........... H01L 29/66636; H01L 29/7843; H01L 29/7847; H01L 29/7848; H01L 29/785
  USPC ...................................................... 438/206
  See application file for complete search history.

(56) References Cited

U.S. PATENT DOCUMENTS

| | | |
|---|---|---|
| 9,620,590 B1 * | 4/2017 | Bergendahl ......... H01L 29/7853 |
| 9,653,289 B1 * | 5/2017 | Balakrishnan ........ H01L 27/088 |
| 9,685,564 B2 | 6/2017 | Sengupta et al. |
| 9,847,390 B1 | 12/2017 | Xie et al. |
| 9,960,232 B2 | 5/2018 | Obradovic et al. |
| 9,984,936 B1 | 5/2018 | Xie et al. |
| 9,991,352 B1 | 6/2018 | Frougier et al. |
| 10,388,755 B1 * | 8/2019 | Lee ..................... H01L 29/0653 |
| 2018/0114834 A1 * | 4/2018 | Cheng ................. H01L 21/0214 |
| 2018/0122900 A1 | 5/2018 | Cheng et al. |

* cited by examiner

10

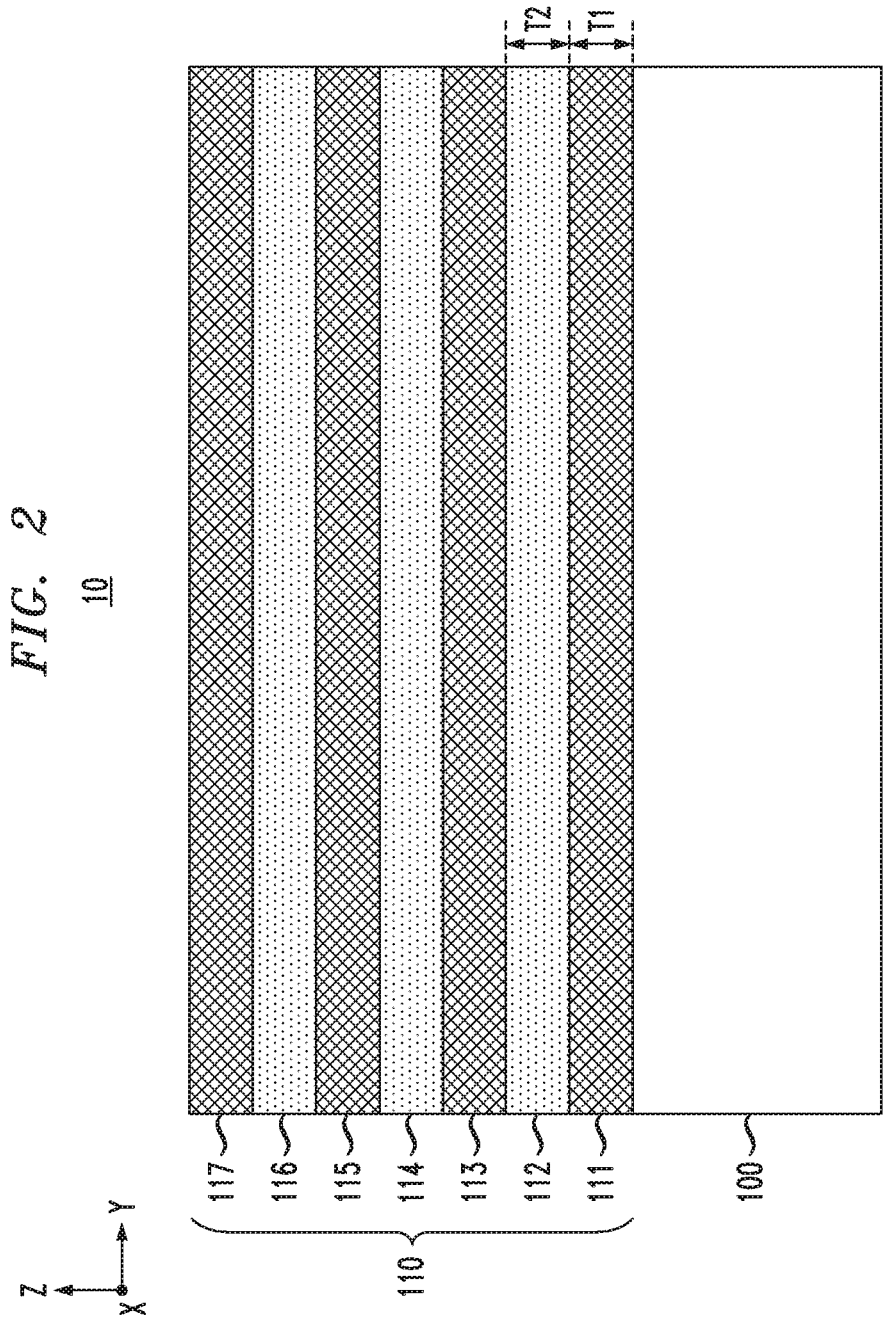

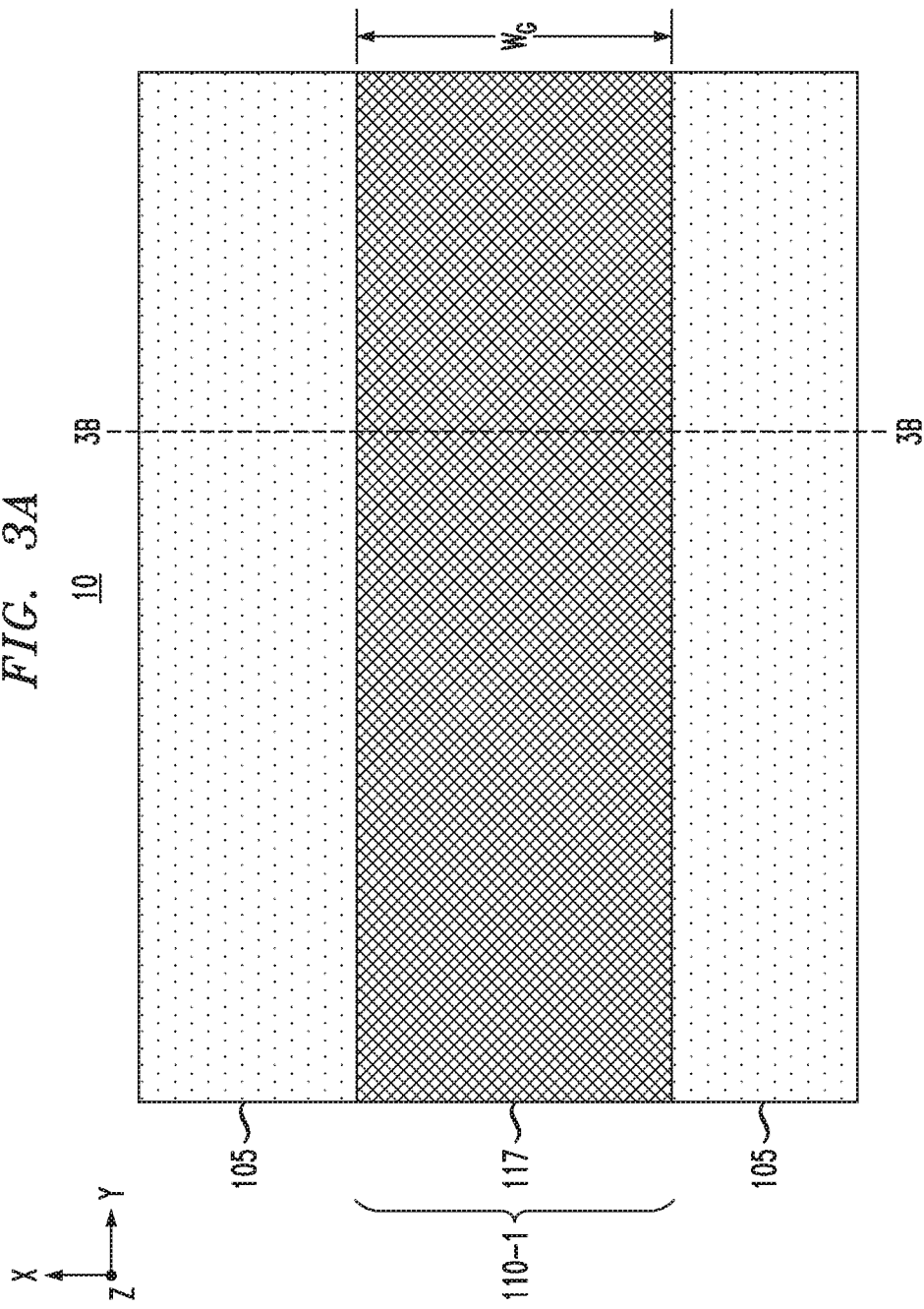

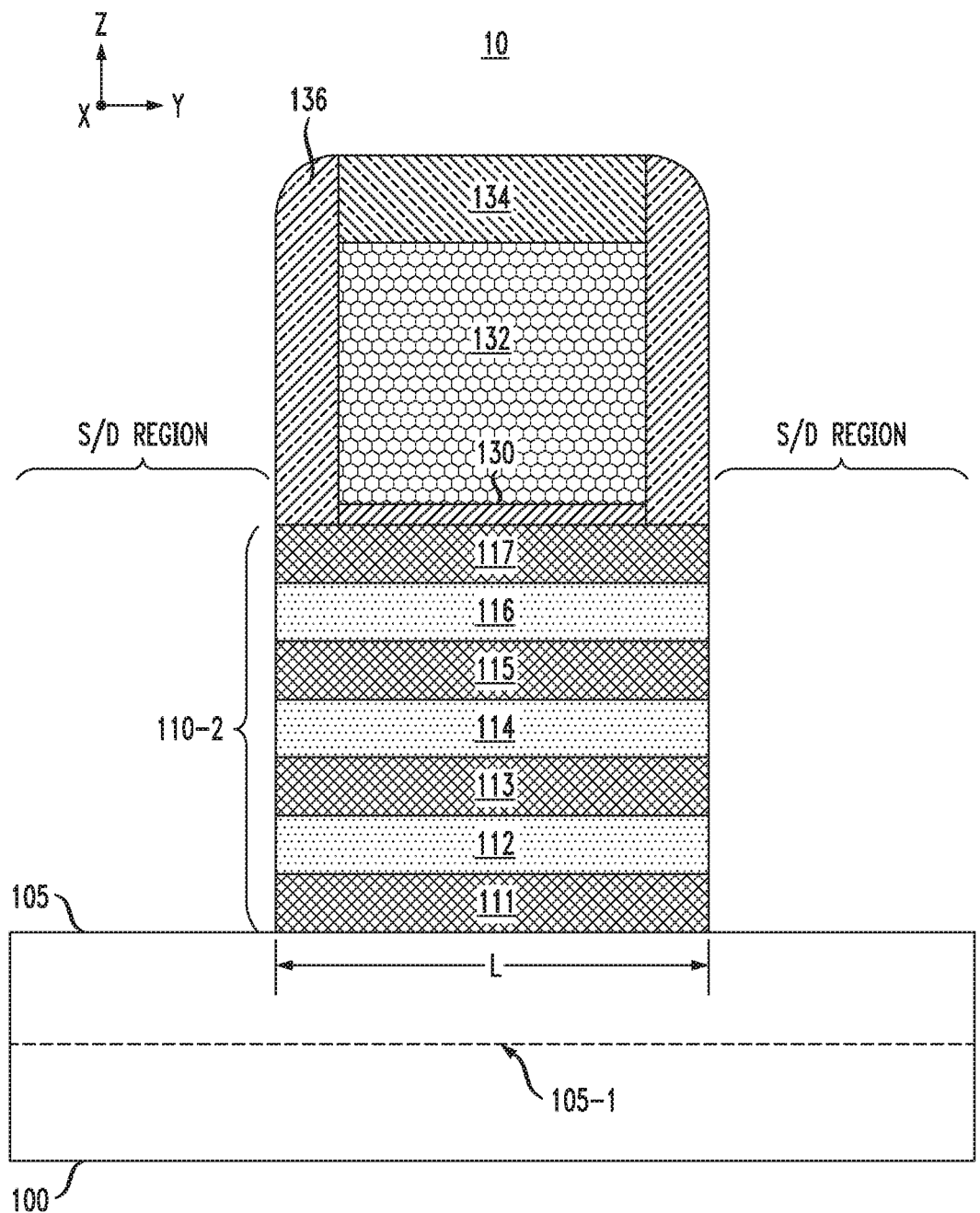

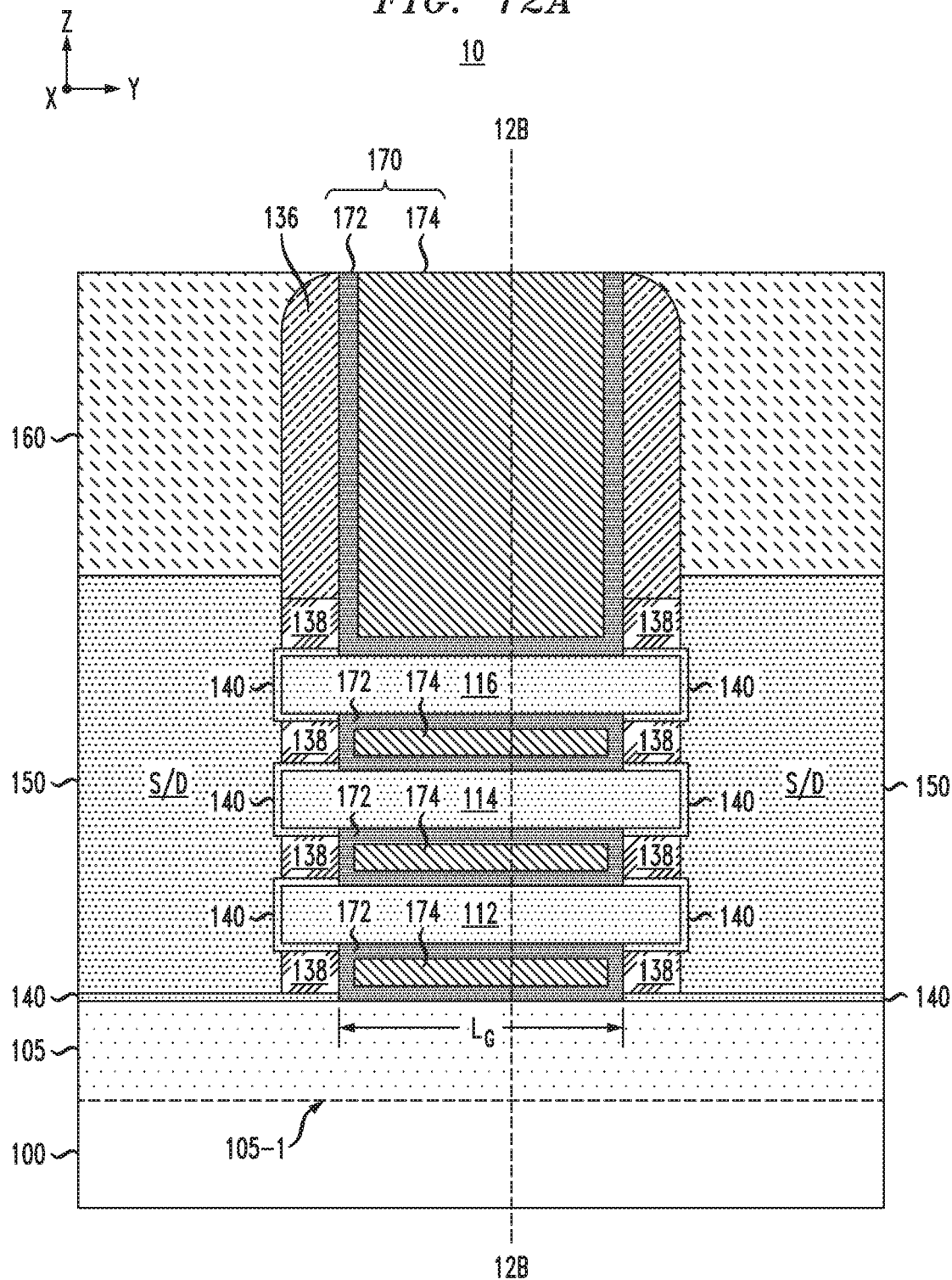

GATE-ALL-AROUND FIELD-EFFECT TRANSISTOR DEVICES HAVING SOURCE/DRAIN EXTENSION CONTACTS TO CHANNEL LAYERS FOR REDUCED PARASITIC RESISTANCE

TECHNICAL FIELD

This disclosure relates generally to semiconductor fabrication techniques and, in particular, to structures and methods for fabricating gate-all-around (GAA) field-effect transistor devices such as nanosheet field-effect transistor devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In gate-all-around (GAA) FET devices such as vertical FETs and nanowire/nanosheet FET devices, the gate material is formed to surround all sides of the active channel layers of such FET devices. In addition, with nanowire/nanosheet FET devices, a common gate structure is formed above and below each nanowire/nanosheet layer in the stacked configuration, thereby increasing the FET device width (or channel width), and thus the drive current, for a given footprint area.

One issue with GAA nanosheet FET devices is parasitic resistance in the electrical path between individual channel layers and epitaxial source/drain elements. In conventional designs, epitaxial source/drain layers are grown from exposed surfaces of the end portions of the channel layers that are surrounded by embedded gate sidewall spacers. With this design, increased parasitic resistance may be realized as a result of (i) the added resistance caused by a defective interface (e.g. voids, unwanted residue material, etc.) between the end surfaces of the semiconductor channel layers and the epitaxial source/drain layers, and (ii) the resistance of the semiconductor channel layers (which are overlapped by the embedded sidewall spacers) along the electrical path from the source/drain layers to the portions of semiconductor channel layers that are surrounded by the FET gate structure. Another issue with regard to GAA nanosheet FET devices is manufacturability due to the weakness or defects in conventional embedded sidewall spacers, which can lead to the loss of source/drain epitaxial material during removal of sacrificial nanosheet layers during a replacement metal gate process to release the active channel layers within the gate region and form a metal gate structure. The increase in parasitic resistance and damage to source/drain epitaxial material result in a reduction in the overall performance of a nanosheet FET device.

SUMMARY

Embodiments of the invention include devices and methods for fabricating a semiconductor integrated circuit device comprising FET devices (e.g., nanosheet FET devices) having source/drain extension contacts to provide reduced parasitic resistance in electrical paths between source/drain layers and active channel layers surrounded by gate structures of the FET devices.

For example, one embodiment includes a method for fabricating a semiconductor device which comprises: forming a field-effect transistor device on a semiconductor substrate, wherein the field-effect transistor device comprises: (i) a nanosheet stack structure comprising a stack of alternating semiconductor layers comprising a plurality of sacrificial nanosheet layers and a plurality of active nanosheet channel layers, wherein each active nanosheet channel layer is disposed between sacrificial nanosheet layers in the nanosheet stack structure; (ii) a dummy gate structure covering the nanosheet stack structure to define a gate region; and (iii) a gate sidewall spacer disposed on sidewalls of the dummy gate structure; laterally recessing exposed sidewall surfaces of the sacrificial nanosheet layers to form recessed regions within the sidewalls of the nanosheet stack structure, wherein the lateral recessing is performed by etching the sacrificial nanosheet layers selective to the active nanosheet channel layers; forming source/drain extension contacts on exposed end portions of the active nanosheet channel layers, wherein the source/drain extension contacts are formed on exposed surfaces of the active nanosheet channel layers within the recessed regions and on exposed sidewall surfaces of the active nanosheet channel layers; filling a remaining portion of the recessed regions with dielectric material to form embedded gate sidewall spacers; and forming source/drain layers in contact with the source/drain extension contacts.

In another embodiment, a method for fabricating a semiconductor device comprises: forming a field-effect transistor device on a semiconductor substrate, wherein the field-effect transistor device comprises: (i) a nanosheet stack structure comprising a stack of alternating semiconductor layers comprising a plurality of sacrificial nanosheet layers and a plurality of active nanosheet channel layers, wherein each active nanosheet channel layer is disposed between sacrificial nanosheet layers in the nanosheet stack structure; (ii) a dummy gate structure covering the nanosheet stack structure to define a gate region; and (iii) a gate sidewall spacer disposed on sidewalls of the dummy gate structure; laterally recessing exposed sidewall surfaces of the sacrificial nanosheet layers to form recessed regions within the sidewalls of the nanosheet stack structure, wherein the lateral recessing is performed by etching the sacrificial nanosheet layers selective to the active nanosheet channel layers, wherein the recessed regions have a recess depth which exposes portions of the active nanosheet channel layers overlapped by the dummy gate structure, which define a gate length of the field-effect transistor device; forming sacrificial inner spacers within the recessed regions to cover the exposed portions of the active nanosheet channel layers that define the gate length of the field-effect transistor device; forming epitaxial source/drain extension contacts on exposed end portions of the active nanosheet channel layers, wherein the source/drain extension contacts are formed on exposed surfaces of the active nanosheet channel layers within the recessed regions and on exposed sidewall surfaces of the active nanosheet channel layers; filling a remaining portion of the recessed regions with dielectric material to form embedded gate sidewall spacers which are disposed adjacent to the sacrificial inner spacers; forming epitaxial source/drain extension layers in contact with the epitaxial source/drain extension contacts; selectively removing the dummy gate structure to open the gate region and expose the nanosheet stack structure and the sacrificial inner spacers within the gate region; selectively removing the sacrificial nanosheet layers exposed in the gate region to release the active nanosheet channel layers and form spaces between the active nanosheet channel layers; selectively removing the sacrificial inner spacers within the spaces between the active channel layers, wherein the sacrificial inner spacers are formed of a material that has an etch selectivity with respect to materials of the sacrificial nanosheet layers, the active nanosheet channel layers, the embedded gate sidewall spacers, and the source/drain extension contacts; and forming a high-k dielectric/metal gate structure within the gate region to surround the active nanosheet channel layers; wherein the source/drain extension contacts are disposed between the embedded gate sidewall spacers and the active nanosheet channel layers, and extend from source/drain layers to the high-k dielectric/metal gate structure.

Another embodiment includes a semiconductor integrated circuit device which comprises: a field-effect transistor device disposed on a semiconductor substrate. The field-effect transistor device comprises: a nanosheet stack structure comprising a plurality of active nanosheet channel layers that are separated by a channel spacing; a high-k dielectric/metal gate structure surrounding the active nanosheet channel layers; a gate sidewall spacer disposed on sidewalls of the high-k dielectric/metal gate structure, the gate sidewall spacer comprising embedded gate sidewall spacers disposed between end portions of the active nanosheet channel layers to insulate the high-k dielectric/metal gate structure from source/drain layers; source/drain extension contacts disposed on end portions of the active nanosheet channel layers, wherein the source/drain extension contacts are disposed between the embedded gate sidewall spacers and the active nanosheet channel layers, and on sidewall surfaces of the active nanosheet channel layers; and source/drain layers disposed in contact with the source/drain extension contacts; wherein the source/drain extension contacts laterally extend from source/drain layers to the high-k dielectric/metal gate structure.

Other embodiments will be described in the following detailed description of embodiments, which is to be read in conjunction with the accompanying figures.

BRIEF DESCRIPTION OF THE DRAWINGS

FIGS. 1A, 1B and 1C are schematic views of a semiconductor integrated circuit device comprising a nanosheet FET device having source/drain extension contacts for reduced parasitic resistance, according to an embodiment of the invention, wherein:

FIG. 1A is a schematic cross-sectional side view showing a structure of the nanosheet FET device disposed in a given device region of the semiconductor integrated circuit device;

FIG. 1B is a schematic cross-sectional side view showing the structure of the nanosheet FET device along line 1B-1B shown in FIG. 1A; and FIG. 1C is a schematic cross-sectional side view showing the structure of the nanosheet FET device along line 1C-1C shown in FIG. 1A.

FIGS. 2-12B schematically illustrate a method for fabricating a nanosheet FET device comprising source/drain extension contacts to semiconductor channel layers for reduced parasitic resistance, according to an embodiment of the invention, wherein:

FIG. 2 is a schematic cross-sectional side view of a semiconductor integrated circuit device at an initial stage of fabrication comprising a semiconductor substrate and a nanosheet stack structure formed on the semiconductor substrate;

FIG. 3A is a schematic top plan view of the semiconductor structure of FIG. 2 after patterning the nanosheet stack structure to form an elongated nanosheet structure and after forming a shallow trench isolation layer in the semiconductor substrate;

FIG. 4B is a schematic cross-sectional side view of the semiconductor structure along line 4B-4B shown in FIG. 4A;

FIG. 5 is a schematic cross-sectional side view of the semiconductor structure shown in FIG. 4B after laterally recessing exposed sidewall surfaces of the sacrificial nanosheet layers of the nanosheet stack structure to form recesses in the sidewalls of the nanosheet stack structure;

FIG. 6 is a schematic cross-sectional side view of the semiconductor structure shown in FIG. 5 after depositing a conformal layer of insulating material to fill the recesses in the sidewalls of the nanosheet stack structure with the insulating material;

FIG. 7 is a schematic cross-sectional side view of the semiconductor structure shown in FIG. 6 after patterning the conformal layer of insulating material to form sacrificial inner spacers within the recessed regions;

FIG. 8 is a schematic cross-sectional side view of the semiconductor structure shown in FIG. 7 after growing epitaxial semiconductor material on exposed surfaces of the active nanosheet channel layers to form source/drain extension contacts;

FIG. 9 is a schematic cross-sectional side view of the semiconductor structure shown in FIG. 8 after forming embedded gate sidewall spacers within remaining portions of the recessed regions adjacent to the sacrificial inner spacers;

FIG. 10 is a schematic cross-sectional side view of the semiconductor structure shown in FIG. 9 after forming source/drain layers of the nanosheet FET device and forming an insulating layer to cover the nanosheet FET device;

FIG. 12A is a schematic cross-sectional side view of the semiconductor structure shown in FIG. 11B after removing the sacrificial inner spacers and forming a high-k dielectric/metal gate structure; and FIG. 12B is a schematic cross-sectional side view of the semiconductor structure along line 12B-12B shown in FIG. 12A.

DETAILED DESCRIPTION

Figure 1A:
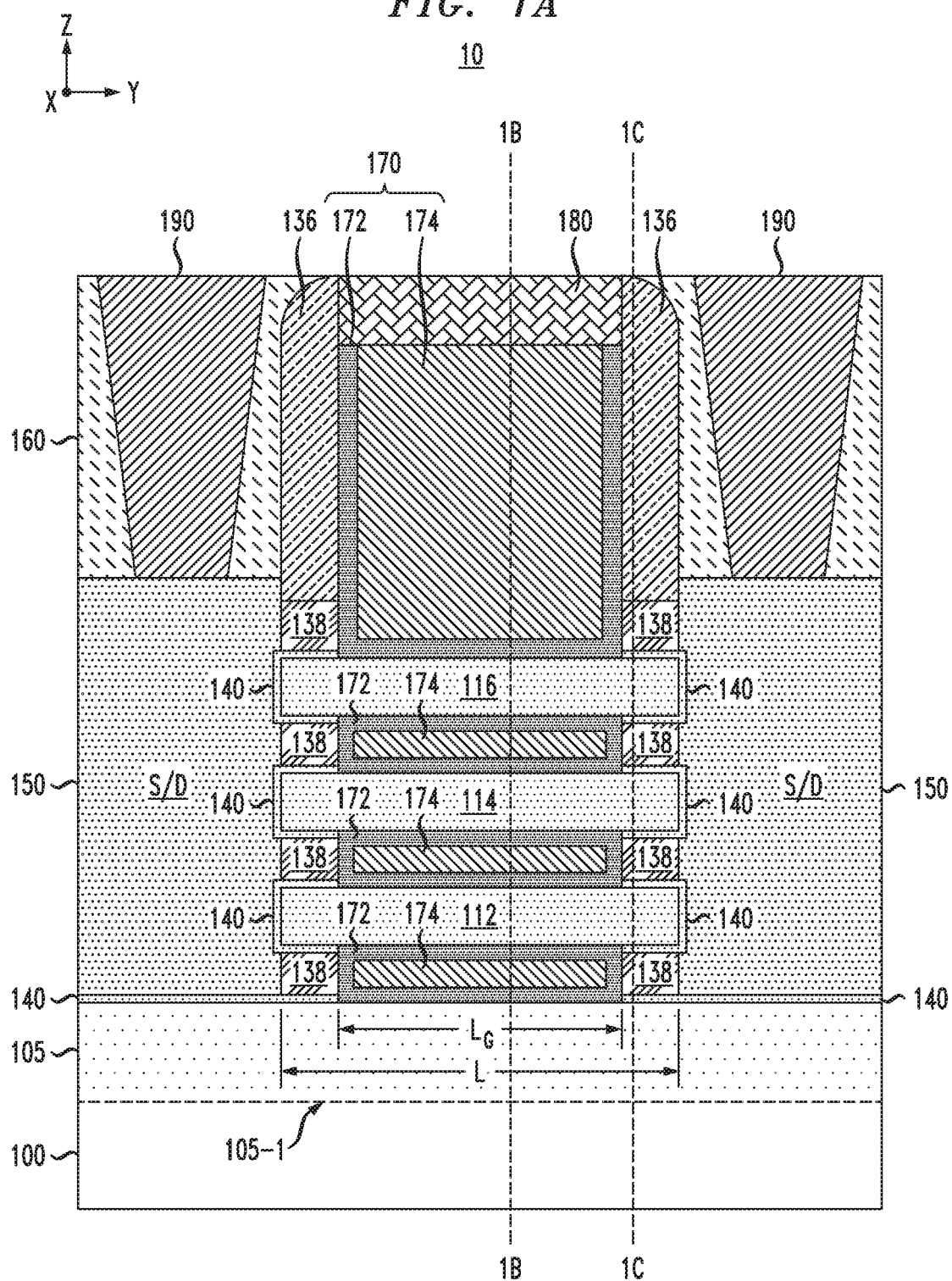

Embodiments of the invention will now be described in further detail with regard devices and methods for fabricating a semiconductor integrated circuit device comprising FET devices (e.g., nanosheet FET devices) having source/drain extension contacts to provide reduced parasitic resistance in electrical paths between source/drain layers and active channel layers surrounded by gate structures of the FET devices. For illustrative purposes, exemplary embodiments of the invention will be discussed in the context of nanosheet FET devices, but it is to be understood that the fabrication techniques discussed herein are readily applicable to various types of gate-all-around FET devices such as vertical fin-type FETs, nanowire FETs, and other types of GAA FET devices having gate structures that are formed around all sides of active channel layers.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
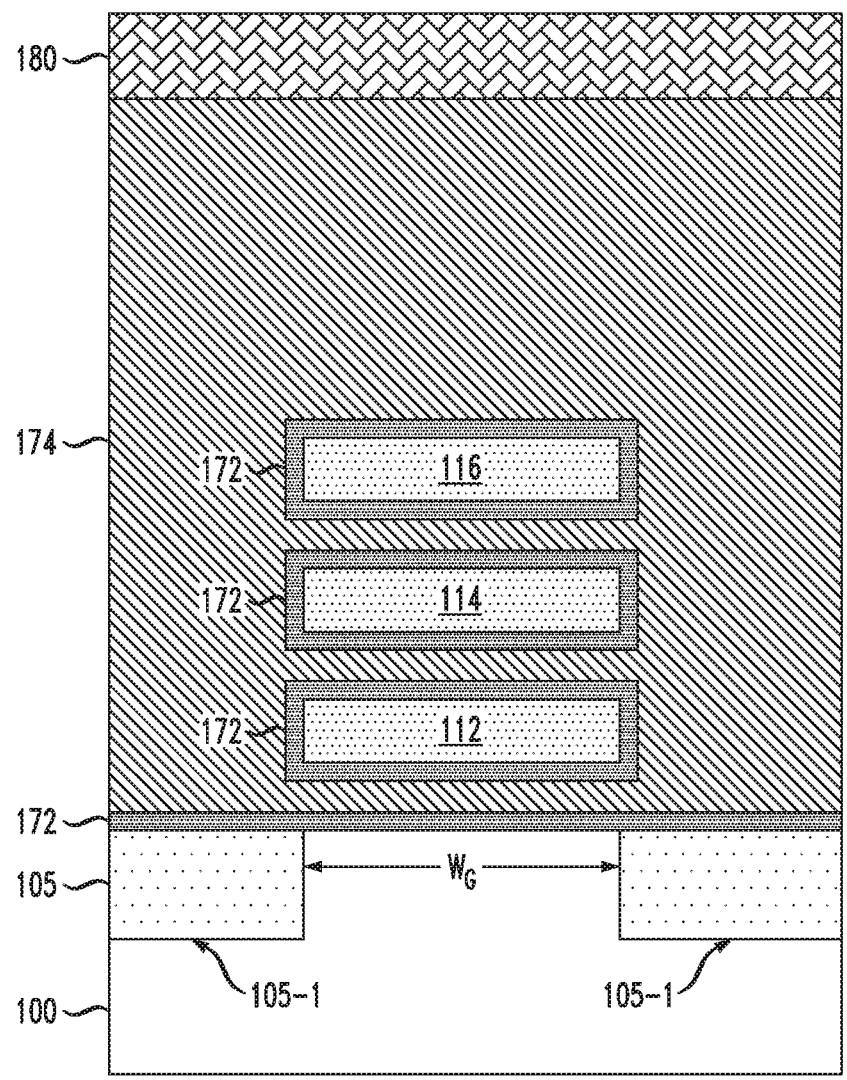
Figure 1C:
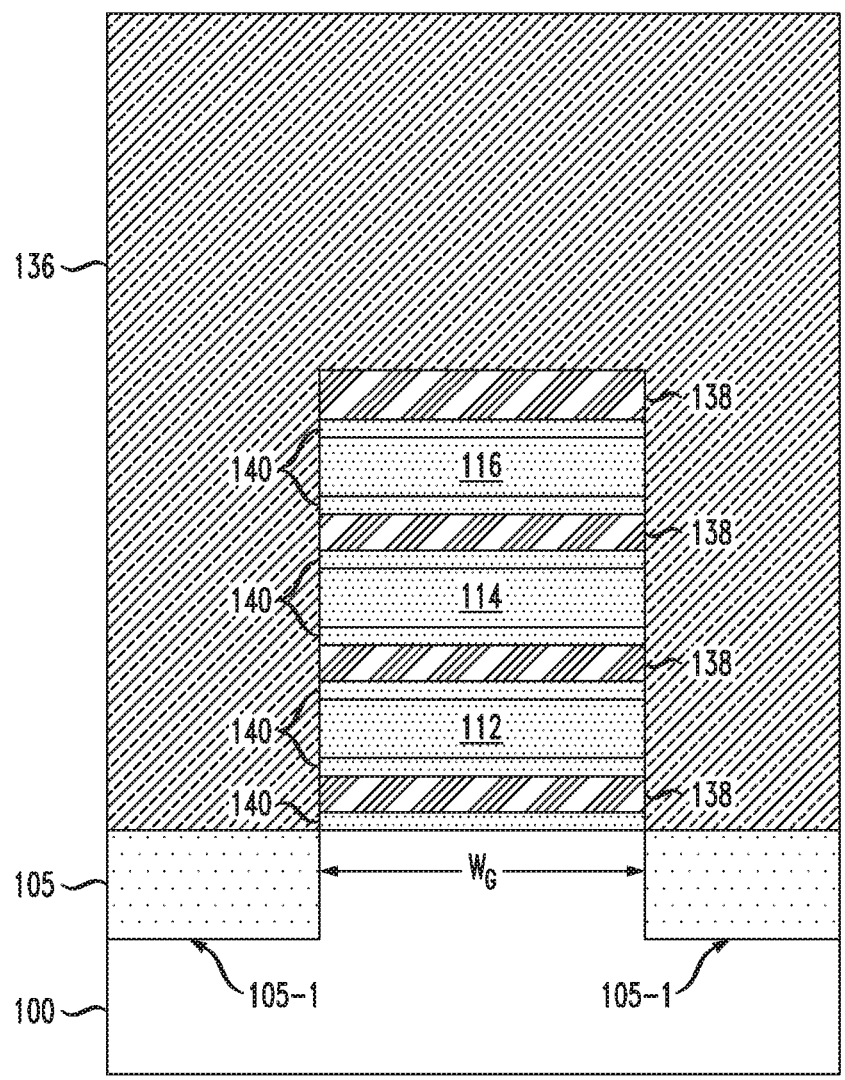

FIGS. 1A, 1B and 1C are schematic views of a semiconductor integrated circuit device 10 comprising a nanosheet FET device that is fabricated to have source/drain extension contacts to channel layers for reduced parasitic resistance, according to an embodiment of the invention. More specifically, FIG. 1A is a schematic cross-sectional side view (Y-Z plane) showing a structure of the nanosheet FET device disposed in a given device region of the semiconductor integrated circuit device 10. FIG. 1B is a schematic cross-sectional side view (X-Z plane) showing the structure of the nanosheet FET device of the semiconductor integrated circuit device 10 along line 1B-1B shown in FIG. 1A. FIG. 1C is a schematic cross-sectional side view (X-Z plane) showing the structure of the nanosheet FET device of the semiconductor integrated circuit device 10 along line 1C-1C shown in FIG. 1A.

As illustrated in FIGS. 1A, 1B and 1C, the semiconductor integrated circuit device 10 comprises a semiconductor substrate 100, and a shallow trench isolation layer 105 disposed within a trench 105-1 formed in the semiconductor substrate 100. The nanosheet FET device comprises a stack of active nanosheet channel layers 112, 114, and 116, source/drain extension contacts 140, source/drain (S/D) layers 150, and a gate structure comprising gate sidewall spacers 136 and 138, a high-k dielectric/metal gate (HKMG) structure 170, and a gate capping layer 180. The semiconductor integrated circuit device 10 further comprises an insulating layer 160 (e.g., an interlayer dielectric (ILD) layer or a PMD (pre-metal dielectric) layer), and vertical source/drain contacts 190, which are formed as part of a middle-of-the-line (MOL) layer of the semiconductor integrated circuit device 10. It is to be understood that the term "source/drain region" as used herein means that a given source/drain region can be either a source region or a drain region, depending on the application or circuit configuration.

The HKMG structure 170 comprises a gate dielectric layer 172 and a metal gate structure 174. The gate dielectric layer 172 is formed by conformal deposition of one or more layers of high-k dielectric material. For example, the high-k gate dielectric layer 172 can be formed using high-k dielectric materials such as HfO2, HfSiO, HfZrO, and/or nitrided films thereof. In some embodiments, a thin interfacial silicon oxide layer is formed on the epitaxial silicon surfaces of the active nanosheet channel layers 112, 114, and 116 prior to forming the high-k gate dielectric layer 172.

In some embodiments, the metal gate structure 174 comprises one or more work function metal (WFM) layers which are formed to achieve a target threshold voltage for the nanosheet FET device, and a metal layer that fills the gate region to form a metal gate electrode. For example, the WFM layers may comprise a layer of titanium nitride (TiN) and a layer of an aluminum (Al) containing alloy material such as titanium aluminum carbide (TiAlC), TiAl, AlC, etc. In addition, a metallic gate electrode can be formed by filling the remaining portion of the gate region with a low resistance metallic material such as tungsten, cobalt, ruthenium, etc. In some embodiments, the metal gate electrode is formed by filling the gate region with one or more of the work function metals used to form the WFM layer(s) such that the entire metal gate 174 is formed of one or more WFM layers. As schematically illustrated in FIGS. 1A and 1B, the HKMG structure 170 is formed to surround all sides (top, bottom, sidewalls) of the active channel layers 112, 114, and 116 to provide a GAA FET structure.

Further, as shown in FIGS. 1A, 1B and 1C, the gate sidewall spacers 136 and 138 define a gate region of the nanosheet FET device which surrounds/contains the HKMG structure 170. The gate sidewall spacer 136 serves to electrically insulate the HKMG structure 170 from surrounding elements (e.g., the S/D layers 150, the ILD layer 160, the vertical S/D contacts 190, etc.). Further, the gate sidewall spacers 138 comprise embedded gate sidewall spacers (or internal spacers) which are formed between end portions of the active nanosheet channel layers 112, 114, and 116 and serve to insulate the HKMG structure 170 from the source/drain layers 150.

In one embodiment, the active nanosheet channel layers 112, 114, and 116 are formed of an epitaxial semiconductor material such as epitaxial silicon and have a same thickness, a same length L, and a same width which defines a gate width $W_G$ of the nanosheet FET device. As shown in FIG. 1A, the portions of the active nanosheet channel layers 112, 114 and 116 which are overlapped by the HKMG structure 170 define the gate length $L_G$ (or channel length) of the nanosheet FET device, although the active nanosheet channel layers 112, 114, and 116 are physically longer (length L) than the gate length $L_G$. In conventional nanosheet FET devices, the portions of the semiconductor channel layers 112, 114, and 116 which are overlapped by the embedded gate sidewall spacers 138 provide an electrically resistive path S/D layers 150 and the portions of the semiconductor channel layers 112, 114, and 116 that are overlapped/surrounded by the HKMG structure 170 (i.e., the portions of the semiconductor channel layers 112, 114, and 116 that define the gate length $L_G$ of the nanosheet FET device).

In accordance with embodiments of the invention, the source/drain extension contacts 140 comprise epitaxial layers that are grown on the end portions of the active nanosheet channel layers 112, 114 and 116 which are overlapped by the embedded sidewall spacers 138. The source/drain extension contacts 140 serve to reduce the parasitic resistance in the end portions of the semiconductor channel layers 112, 114 and 116 between the source/drain layers 150 and the portions of the semiconductor channel layers 112, 114 and 116 that are overlapped by the HKMG structure 170. In addition, the source/drain extension contacts 140 formed on the end portions of the semiconductor channel layers 112, 114, and 116 provide an increased surface area to serve as a seed for the epitaxial growth of the epitaxial S/D layers 150.

FIGS. 2-12B schematically illustrate a method for fabricating a nanosheet FET device comprising source/drain extension contacts to semiconductor channel layers for reduced parasitic resistance, according to an embodiment of the invention. In particular, for illustrative purposes, FIGS. 2-12B schematically illustrate a method for fabricating semiconductor integrated circuit device 10 with the nanosheet FET device as shown in FIGS. 1A, 1B and 1C. To begin, FIG. 2 is a schematic cross-sectional side view (X-Z plane) of the semiconductor device 10 at an initial stage of fabrication comprising a semiconductor substrate 100, and a nanosheet stack structure 110 formed on the semiconductor substrate 100. The nanosheet stack structure 110 comprises a stack of alternating epitaxial semiconductor layers 111-117.

While the semiconductor substrate 100 is illustrated as a generic substrate layer, it is to be understood that the semiconductor substrate 100 may comprise one of different types of semiconductor substrate structures and materials. For example, in one embodiment, the semiconductor substrate 100 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 100 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 100 (e.g., wafer) being processed.

The stack of alternating epitaxial semiconductor layers 111-117 of the nanosheet stack structure 110 comprises sacrificial nanosheet layers 111, 113, 115, and 117, and active nanosheet channel layers 112, 114, and 116, wherein each active nanosheet channel layer 112, 114, and 116 is disposed between the sacrificial nanosheet layers in the nanosheet stack structure 110. The stack of alternating semiconductor layers 111-117 comprises epitaxial semiconductor layers that are sequentially grown. For example, the sacrificial nanosheet layer 111 is epitaxially grown on a surface of the semiconductor substrate 100, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, the sacrificial nanosheet layer 115 is epitaxially grown on the active nanosheet channel layer 114, the active nanosheet channel layer 116 is epitaxially grown on the sacrificial nanosheet layer 115, and the sacrificial nanosheet layer 117 is epitaxially grown on the active nanosheet channel layer 116.

In one embodiment, the epitaxial semiconductor layers 111-117 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The type of materials that are utilized to form the epitaxial semiconductor layers 111-117 will depend on various factors such as the type of nanosheet FET device (p-type, or n-type), and the desired level of etch selectivity between the semiconductor layers, as well as provide sufficient lattice matching between the materials of the semiconductor layers to ensure proper (e.g., defect-free) epitaxial growth of the crystalline semiconductor layers 111-117.

For example, in one embodiment, the active nanosheet channel layers 112, 114, and 116 are formed of epitaxial silicon (Si). When the active nanosheet channel layers 112, 114, and 116 are formed of crystalline Si, the sacrificial nanosheet layers 111, 113, 115, and 117 (which serve as sacrificial layers that are subsequently etched away to release the active nanosheet channel layers 112, 113, and 116), can be formed of an epitaxial silicon-germanium (SiGe) alloy. This allows the epitaxial SiGe material of the sacrificial nanosheet layers 111, 113, 115, and 117 to be etched selective to the epitaxial Si material of the semiconductor channel layers 112, 114, and 116 in a subsequent process step to "release" the active nanosheet channel layers 112, 114, and 116. In other embodiments, the active nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116. While the nanosheet stack of epitaxial semiconductor layers 110 is shown to include three active nanosheet channel layers 112, 114, and 116, in other embodiments of the invention, the nanosheet stack 110 can be fabricated with more or less than three active nanosheet channel layers.

As shown in FIG. 2, the sacrificial nanosheet layers 111, 113, 115, and 117 are formed with a thickness T1, and the active nanosheet channel layers 112, 114, and 116 are formed with a thickness T2. The thickness T1 of the sacrificial nanosheet layers 111, 113, 115, and 117 defines the spacing size (or channel spacing) above and below the active nanosheet channel layers 112, 114, and 116, in which high-k dielectric material and work function metal is formed. The spacing size (e.g., T1) and the type of WFM material(s) disposed in the spaces above and below the active nanosheet channel layers 112, 114, and 116 defines, in part, the threshold voltage (Vt) of the nanosheet FET device. In one embodiment, the thickness T1 of the sacrificial nanosheet layers 111, 113, 115, and 117 is in a range of about 8 nm to about 10 nm.

The thickness T2 of the semiconductor layers 112, 114, and 116 defines a thickness of the active nanosheet channel layers of the nanosheet FET device. The thickness T2 of the active nanosheet channel layers defines, in part, the threshold voltage (Vt) of the nanosheet FET device (e.g., Vt increases with decreasing channel thickness). In one embodiment, the thickness T2 of the active nanosheet channel layers 112, 114, and 116 is in a range of about 6 nm to about 9 nm, although the active nanosheet channel layers 112, 114, and 116 can be formed with other thickness ranges, depending on the application.

Figure 3B:
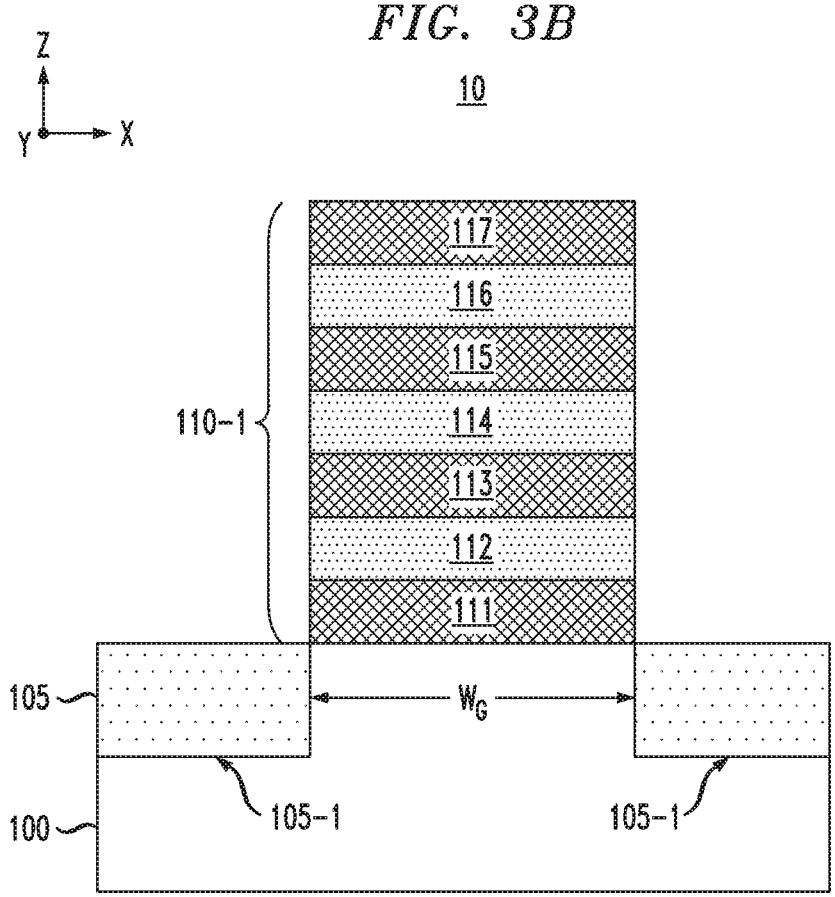
FIG. 3B is a schematic cross-sectional side view of the semiconductor structure along line 3B-3B shown in FIG. 3A.

A next phase of the process flow comprises patterning the nanosheet stack of epitaxial semiconductor layers 110 to define nanosheet stack structures for nanosheet FET devices in different regions of the semiconductor substrate 100. For example, FIGS. 3A and 3B are schematic views of the semiconductor structure of FIG. 2 after patterning the nanosheet stack of epitaxial semiconductor layers 110 to form an elongated nanosheet structure 110-1 (with a defined gate width $W_G$), and after forming a shallow trench isolation (STI) layer 105 in a trench 105-1 etched in the semiconductor substrate 100. In particular, FIG. 3A is a schematic top plan view (X-Y plane) of the resulting semiconductor structure, and FIG. 3B is a schematic cross-sectional side view (X-Z plane) of the resulting semiconductor structure along line 3B-3B shown in FIG. 3A. As shown in FIGS. 3A and 3B, the patterning process results in forming a nanosheet structure 110-1 and recessing the surface of the semiconductor substrate 100 to form STI trenches 105-1. This initial patterning process defines a gate width $W_G$ of the active nanosheet channel layers 112, 114, and 116 of the nanosheet FET device. In one embodiment, the gate width $W_G$ is larger (e.g., 2X or more) than the thickness T2 of the active nanosheet channel layers 112, 114, and 116.

In one embodiment, the patterning process is performed by forming an etch mask (e.g., a lithographic mask) on the nanosheet stack of epitaxial semiconductor layers 110, wherein the etch mask comprises an image of the nanosheet structure 110-1 and the trenches 105-1 to be transferred into the nanosheet stack of epitaxial semiconductor layers 110 and the upper surface of the semiconductor substrate 100 using a sequence of one or more dry etch processes (e.g., reactive ion etching (RIE)). The etch mask can be formed using any suitable patterning process including, but not limited to, a photolithography process, or a multi-patterning process such as a sidewall image transfer (SIT) process, a self-aligned double patterning (SADP) process, a self-aligned quadruple pattering (SAQP), etc. The etching can be performed using one or more sequential dry etch processes with etch chemistries that are suitable to etch the materials of semiconductor layers 111-117 of the nanosheet stack 110 and the semiconductor substrate 100.

As shown in FIG. 3B, as part of the patterning process, the upper surface of the semiconductor substrate 100 is recessed to a target depth to form the trenches 105-1 in which insulating material is deposited to form the STI layers 105. In one embodiment, the STI layers 105 are formed by a process which comprises depositing a layer of insulating material over the surface of the semiconductor structure to cover the nanosheet structure 110-1, planarizing the surface of the semiconductor structure (via chemical mechanical polishing (CMP)) down to an upper surface of the nanosheet structure 110-1 to remove the overburden insulating material, and then performing an etch-back (or recess) process to recess the remaining layer of insulating material down to a target level which defines a thickness of the STI layer 105. In one embodiment, as schematically shown in FIG. 3B, the STI layers 105 are formed with a thickness that is substantially equal to the thickness (or depth) of the trenches 105-1 (i.e., coplanar with an upper surface of the semiconductor substrate 100). The STI layers 105 can be formed of any type of insulating material, such an oxide material, or a combination of multiple insulating materials such as silicon nitride in conjunction with silicon oxide, which is suitable for the given fabrication process flow. The insulating material (e.g., silicon oxide) can be deposited and patterned using known techniques.

Figure 4A:
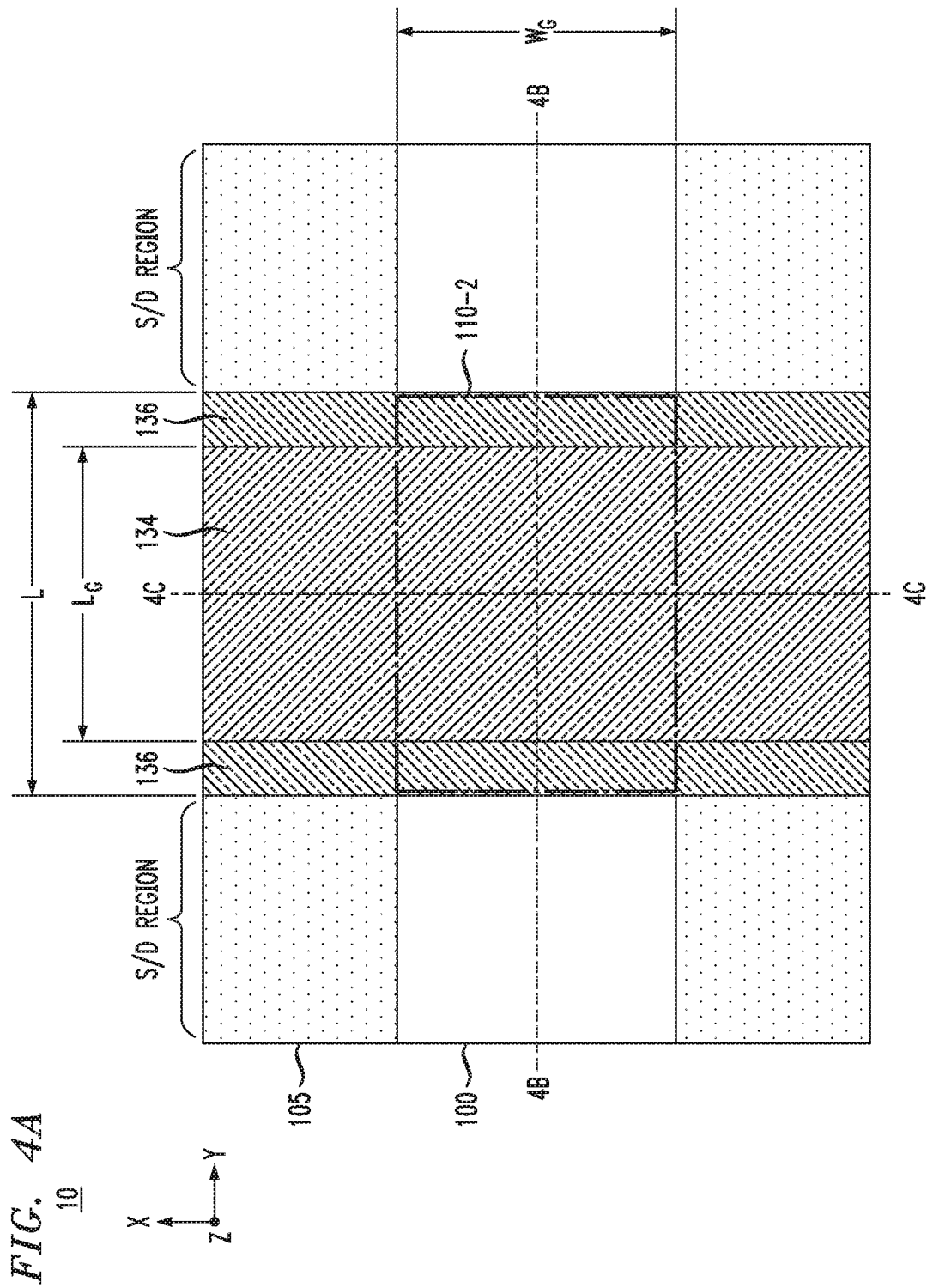
FIG. 4A is a schematic top plan view of the semiconductor structure shown in FIGS. 3A and 3B after forming a dummy gate structure which overlaps a portion of the elongated nanosheet structure, and patterning exposed portions of the elongated nanosheet structure in source/drain regions adjacent to the dummy gate structure to form a nanosheet structure.
Figure 4C:
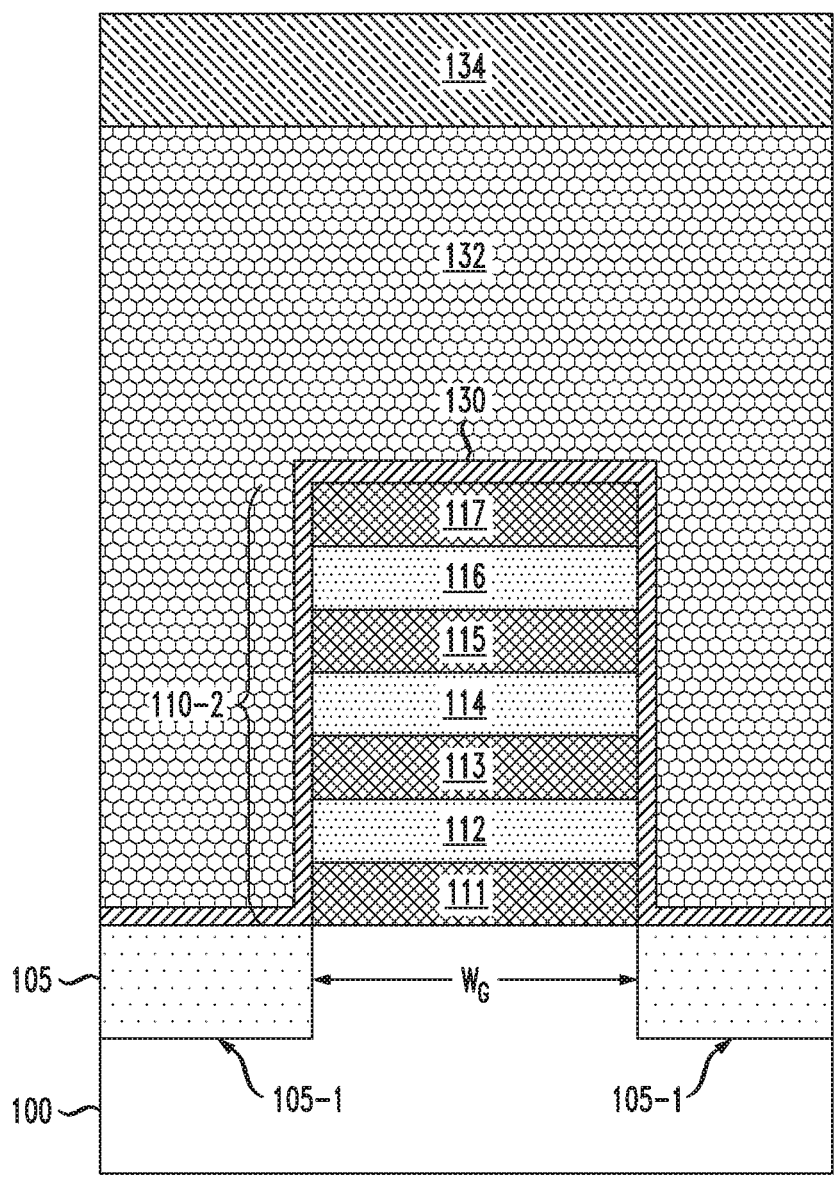
FIG. 4C is a schematic cross-sectional side view of the semiconductor structure along line 4C-4C shown in FIG. 4A.

Next, FIGS. 4A, 4B, and 4C are schematic views of the semiconductor structure shown in FIGS. 3A and 3B after forming a dummy gate structure which overlaps a portion of the elongated nanosheet structure 110-1, and then patterning exposed portions of the elongated nanosheet structure 110-1 in source/drain regions adjacent to the dummy gate structure to form a nanosheet structure 110-2 with a defined length L. In particular, FIG. 4A is a schematic top plan view (X-Y plane) of the resulting semiconductor structure, FIG. 4B is a schematic cross-sectional side view (Y-Z plane) of the resulting semiconductor structure along line 4B-4B shown in FIG. 4A, and FIG. 4C is a schematic cross-sectional side view (X-Z plane) of the resulting semiconductor structure along line 4C-4C shown in FIG. 4A. As shown in FIGS. 4A, 4B, and 4C, the gate structure includes a dummy gate oxide layer 130 and a dummy gate electrode layer 132 (e.g., sacrificial polysilicon or amorphous silicon material). In addition, the gate structure includes a gate capping layers 134 and a gate sidewall spacer 136. The dummy gate oxide layer 130 and the dummy gate electrode layer 132 comprise sacrificial material which is subsequently removed as part of a replacement metal gate (RMG) process and replaced with a high-k gate dielectric material and metallic material to form a HKMG gate structure for the nanosheet FET device.

The semiconductor device structure shown in FIGS. 4A, 4B, and 4C is fabricated using known methods. For example, a thin conformal layer of silicon oxide is deposited over the entire surface of the semiconductor structure shown in FIGS. 3A and 3B, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material or multiple layers of dielectric materials (e.g., SiN, SiOCN, SiBCN). The hard mask layer is then patterned to form the gate capping layer 134, which defines an image of the gate structure. The gate capping layer 134 is then utilized as an etch hardmask to anisotropically etch (e.g., RIE) the sacrificial polysilicon and oxide layers to thereby form the dummy gate layers 130 and 132.

The gate sidewall spacer 136 is then formed by depositing a conformal layer of dielectric material over the entire surface of the semiconductor structure. The conformal layer of dielectric material can be formed of SiN, SiBCN, SiCON, or any other type of low-k dielectric material that is commonly used to form insulating gate sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the nanosheet structure 110-1 and the STI layer 105. The etch process results in the formation of the gate sidewall spacer 136, which surrounds the dummy gate layers 130 and 132 and the gate capping layer 134, as shown in FIGS. 4A-4C. The gate sidewall spacer 136 defines a gate region of the nanosheet FET device.

It is to be understood that FIGS. 4A-4C illustrate an exemplary embodiment in which the gate structure overlaps one nanosheet stack structure 110-1. In practice, the gate structure shown in FIG. 4A, for example, would be an elongated gate structure that extends in the X direction to overlap a plurality of elongated nanosheet stack structures which are disposed in parallel to the elongated nanosheet stack structure 110-1 (FIG. 3A) and commonly patterned from the epitaxial semiconductor nanosheet stack 110 (FIG. 2).

After forming the gate sidewall spacer 136, an anisotropic dry etch process (e.g., RIE) is performed to etch down the exposed portions of the elongated nanosheet stack structure 110-1 in the source/drain regions adjacent to the gate structure down to the upper surface of the semiconductor substrate 100 and the STI layer 105. This etch process results in forming an individual nanosheet stack structure 110-2 of the nanosheet FET device wherein the individual nanosheet stack structure 110-2 has a defined length L in the X-direction (see FIGS. 4A and 4B). The gate width $W_G$ in the X-direction (see FIGS. 4A and 4C) of the resulting nanosheet stack structure 110-2 is maintained since the sidewall surfaces of the nanosheet stack structure 110-2 which define the gate width $W_G$ are covered by the dummy gate layers 130 and 132, and the gate sidewall spacers 136 (see, e.g., FIG. 4C).

Figure 5:
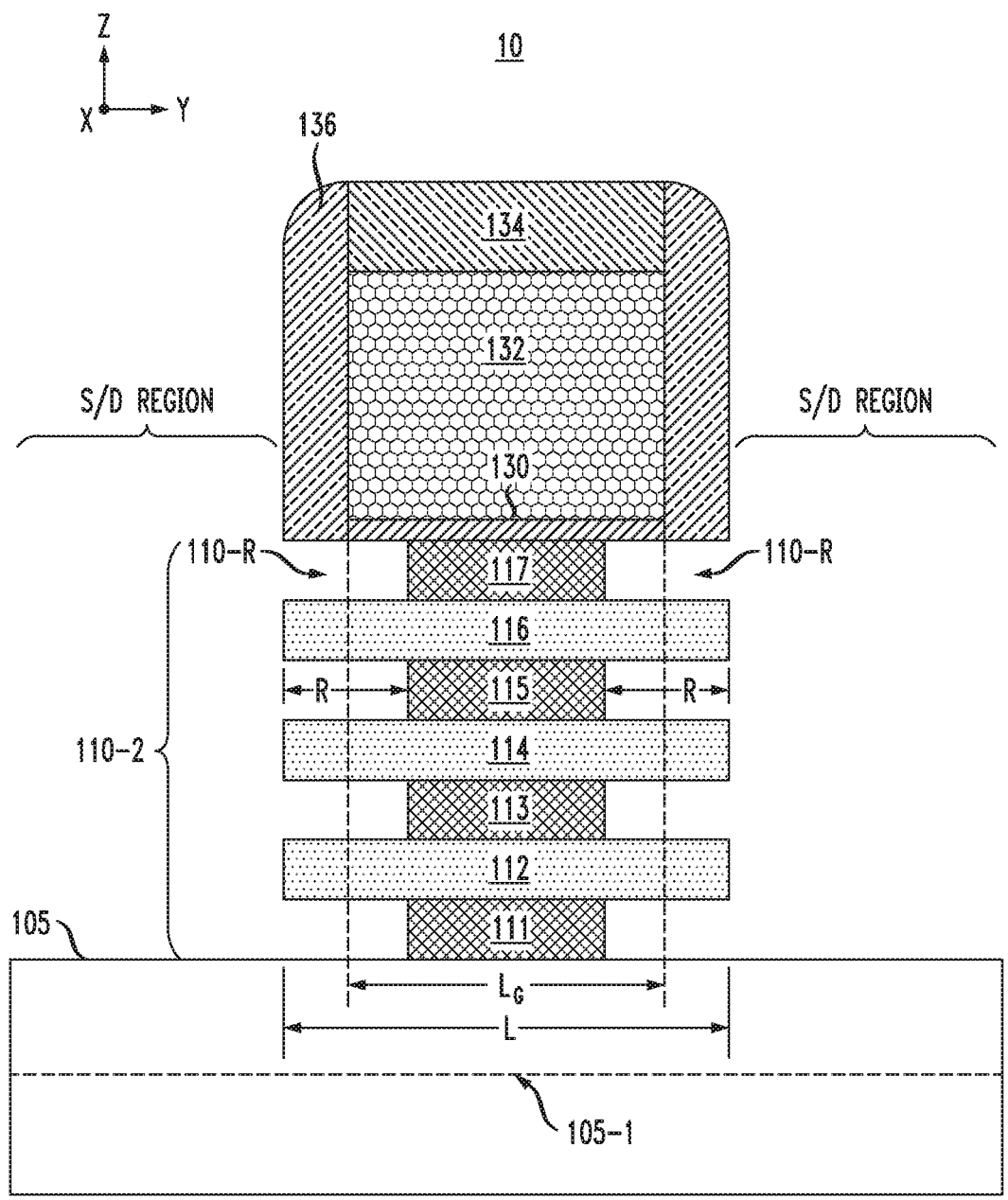

Next, FIG. 5 is a schematic cross-sectional side view of the semiconductor structure shown in FIG. 4B after laterally recessing exposed sidewall surfaces of the sacrificial nanosheet layers 111, 113, 115, and 117 of the nanosheet stack structure 110-2 to form recesses 110-R in the sidewalls of the nanosheet stack structure 110-2. As shown in FIG. 5, the exposed sidewall surfaces of the sacrificial nanosheet layers 111, 113, 115, and 117 are recessed to a recess depth R (in the Y-direction). The depth of the lateral recess R is controlled through a timed etch. In one embodiment, the recess depth R is performed to recess the sacrificial nanosheet layers 111, 113, 115, and 117 to a depth which terminates within the gate region (defined by the sidewall spacer 136) and exposes portions of the active nanosheet channel layers 112, 114, and 114 which define the gate length $L_G$ of the nanosheet FET device. In one embodiment, the recess depth R is about 10 nm. The recess depth R results in a remaining length of the sacrificial layers 111-117 being less than Lg. In other words, the recess depth R is greater than the lateral thickness of the gate sidewall spacer 136.

In one embodiment of the invention, the lateral etch process can be performed using an isotropic wet etch process with an etch solution that is suitable to etch the semiconductor material (e.g., SiGe) of the sacrificial nanosheet layers 111, 113, 115, and 117 of the nanosheet stack structure 110-2 selective to the semiconductor material (e.g., Si) of the active nanosheet channel layers 112, 114, and 116, and other exposed elements. In another embodiment, an isotropic dry plasma etch process can be performed to laterally etch the exposed sidewall surfaces of the sacrificial nanosheet layers 111, 113, 115, and 117 selective to the active nanosheet channel layers 112, 114, and 116, and other exposed elements.

Figure 6:
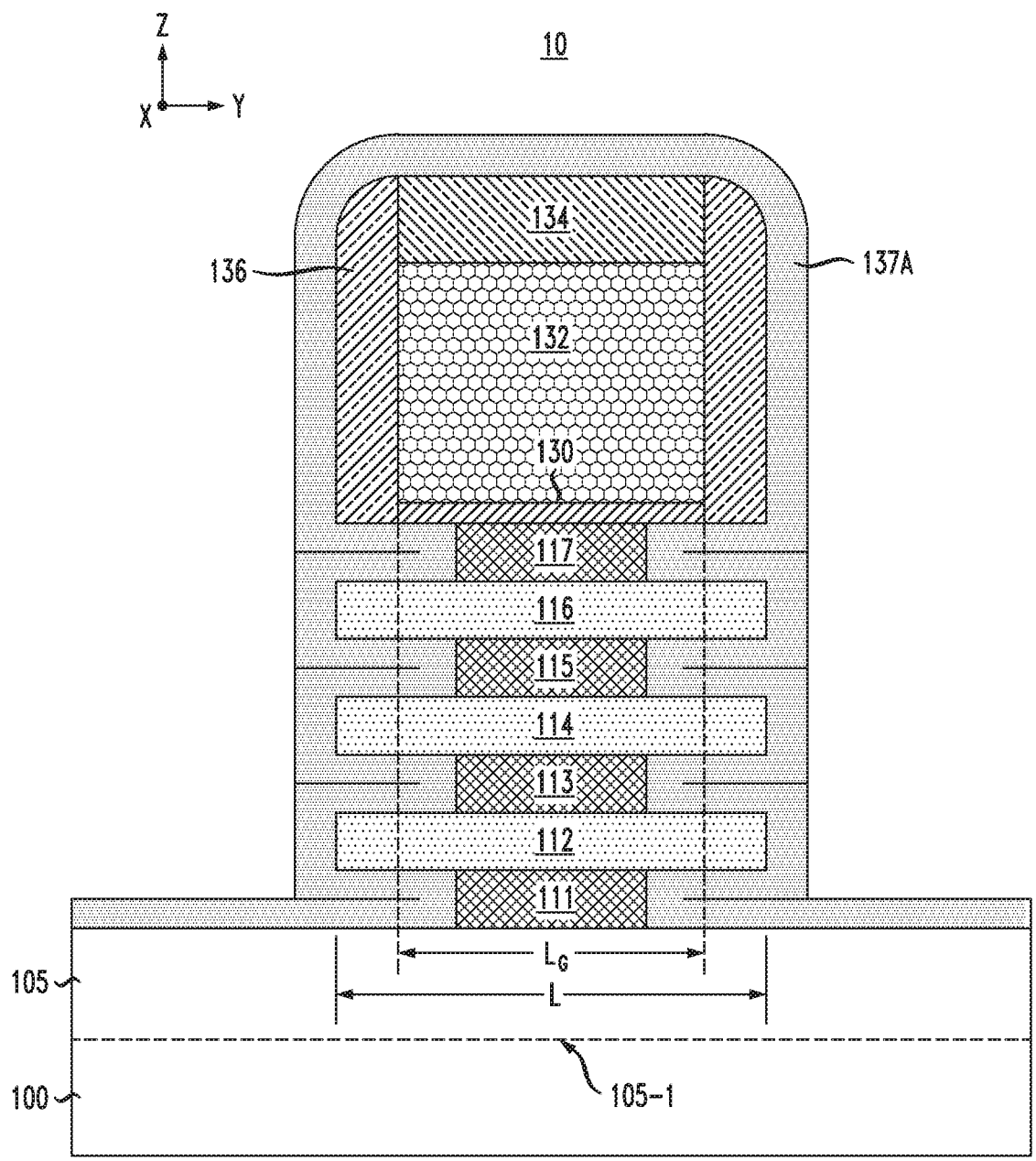
Figure 7:
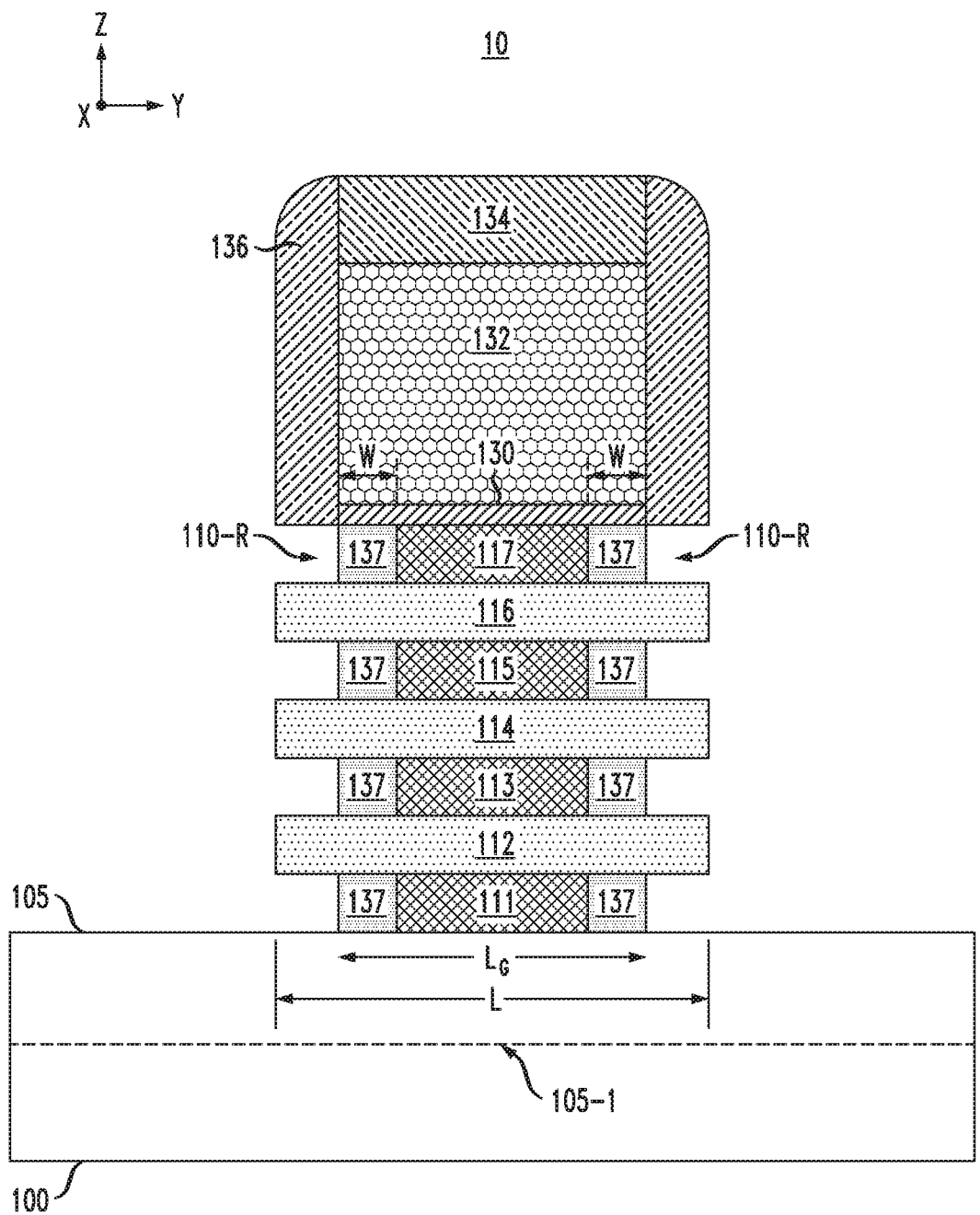

A next phase of the fabrication process comprises forming sacrificial inner spacers within the recessed regions 110-R using a process flow as schematically illustrated in FIGS. 6 and 7. In particular, FIG. 6 is a schematic cross-sectional side view of the semiconductor structure shown in FIG. 5 after depositing a conformal layer of insulating material 137A to fill the recesses 110-R in the vertical sidewalls of the nanosheet stack structure 110-2 with insulating material. In one embodiment, the conformal layer of insulating material 137A is formed by conformally depositing a layer of silicon oxide material (e.g., SiO2) over the semiconductor structure until the recesses 110-R are filled with insulating material. In one embodiment, the insulating material 137A is conformally deposited using a highly conformal deposition process, such as ALD, to ensure that the recesses 110-R are sufficiently filled with the insulating material. In some embodiments, the deposition thickness of the insulating material 137A is equal or greater than half of the vertical distance between adjacent nanosheets so that after the deposition, the insulating material pinches off to completely fill the recesses, as schematically illustrated in FIG. 6. Other deposition methods such as CVD and PVD can be utilized to deposit a highly conformal layer of insulating/dielectric material to fill the recesses 110-R.

Next, FIG. 7 is a schematic cross-sectional side view of the semiconductor structure shown in FIG. 6 after patterning the conformal layer of insulating material 137A to form sacrificial inner spacers 137 within the recessed regions 110-R. In one embodiment, the sacrificial inner spacers 137 are formed by performing an etch back process to remove the excess insulating material on the gate structure and the substrate 100 and recess the insulating material 137A within the recesses 110-R to a target depth to form the sacrificial inner spacers 137. In one embodiment, the insulating material 137A within the recesses 110-R is recessed to a depth that is substantially equal to the thickness of the gate sidewall spacer 136 such that the resulting sacrificial inner spacers 137 are formed with a width W that covers the exposed portions of the active nanosheet channel layers 112, 114, and 116 within the gate region which define the gate length $L_G$ of the nanosheet FET device. As explained in further detail below, the sacrificial inner spacers 137 serve to confine the epitaxial growth of the source/drain extension contacts 140 during a subsequent processing stage and to prevent the source/drain extension contacts 140 from being formed on the portions of the active nanosheet channel layers 112, 114, and 116 which define the gate length $L_G$ of the nanosheet FET device.

Figure 8:
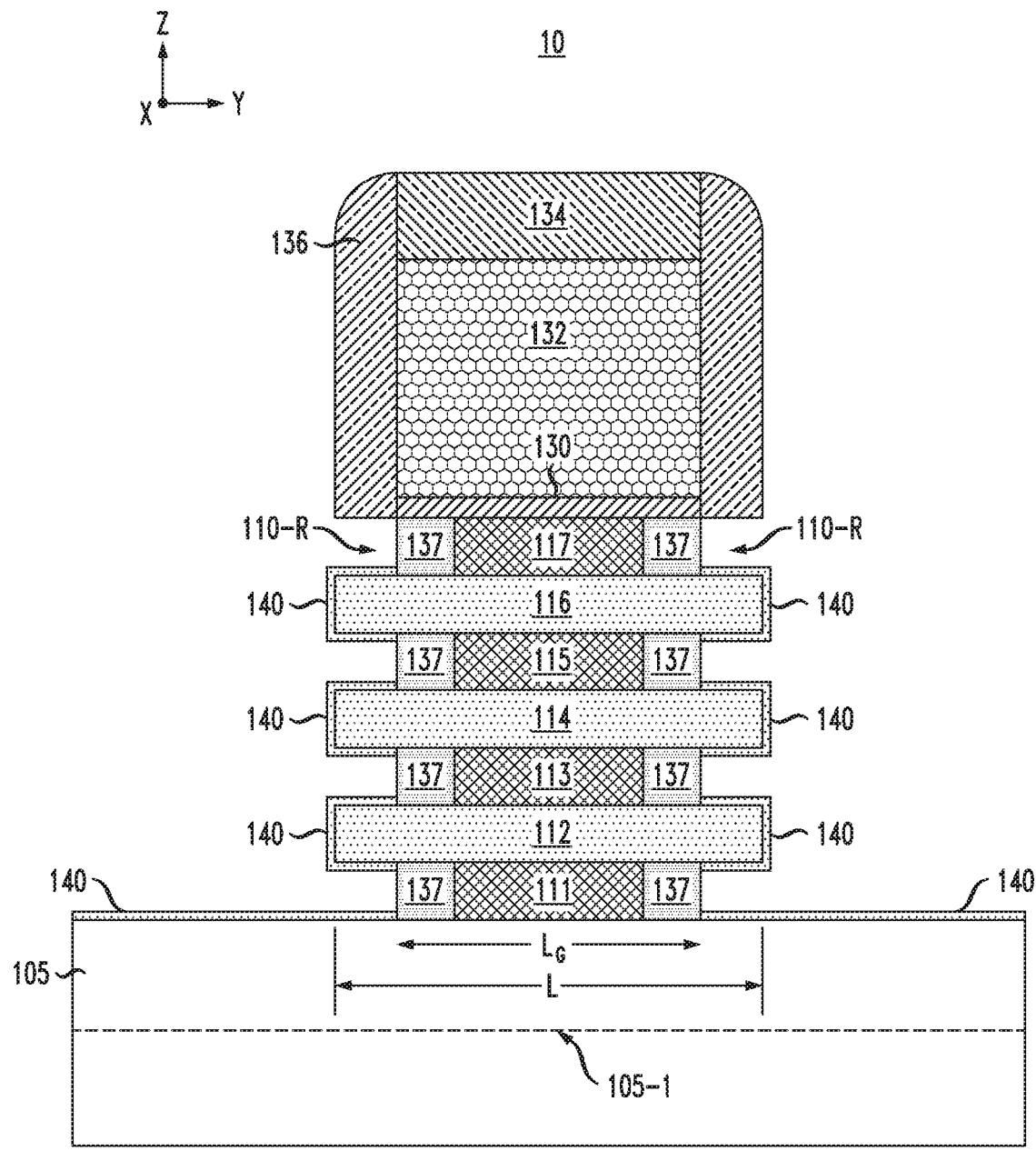

A next step in the fabrication process comprises forming the source/drain extension contacts 140 on the exposed surfaces of the active nanosheet channel layers 112, 114, and 116, as shown in FIG. 8. In particular, FIG. 8 is a schematic cross-sectional side view of the semiconductor structure shown in FIG. 7 after growing epitaxial semiconductor material on the exposed surfaces of the active nanosheet channel layers 112, 114, and 116 to form the source/drain extension contacts 140. In one embodiment, the source/drain extension contacts 140 are formed of the same epitaxial material as the active nanosheet channel layers 112, 114, and 116. For example, the active nanosheet channel layers 112, 114 and 116 and the source/drain extension contacts 140 can be formed of crystalline epitaxial Si. In other embodiments, to achieve FET mobility enhancement, the source/drain extension contacts 140 can be formed of an epitaxial material which is different from the epitaxial material of the active nanosheet channel layers 112, 114, and 116 to impart stress on the channel layers.

For example, for P-type nanosheet FET devices, when the active nanosheet channel layers 112, 114, and 116 are formed of epitaxial Si, the source/drain extension contacts 140 can be formed of epitaxial SiGe (with relatively high Ge concentration). Furthermore, for N-type nanosheet FET devices, when the active nanosheet channel layers 112, 114, and 116 are formed of epitaxial Si, the source/drain extension contacts 140 can be formed of epitaxial carbon doped silicon (Si:C).

In all embodiments, the source/drain extension contacts 140 are formed with a thickness in a range of about 2 nm to about 4 nm. The source/drain extension contacts 140 are formed using any suitable epitaxial deposition process for growing layers of epitaxial semiconductor material (which form the source/drain extension contacts 140) on the exposed semiconductor surfaces of the active nanosheet channel layers 112, 114, and 116. The sacrificial inner spacers 137 serve to confine the epitaxial growth of the source/drain extension contacts 140 and prevent the source/drain extension contacts 140 from being formed on the portions of the active nanosheet channel layers 112, 114, and 116 which define the gate length $L_G$ of the nanosheet FET device. As further shown in FIG. 8, the epitaxial growth results in formation of epitaxial semiconductor material 140 on the exposed semiconductor surfaces of the substrate 100 in the source/drain regions.

In some embodiments, the source/drain extension contacts 140 can be doped during deposition (in-situ doped) by adding dopants during the epitaxy process, for example, n-type dopants (e.g., phosphorus or arsenic) for NFETs, and p-type dopants (e.g., boron or gallium) for PFETs. The dopant concentration in the source/drain extension contacts 140 can range from $1 \times 10^{19}$ cm$^{-3}$ to $1 \times 10^{21}$ cm$^{-3}$, or preferably between $2 \times 10^{19}$ cm$^{-3}$ to $1 \times 10^{20}$ cm$^{-3}$. Alternatively, the source/drain extension contacts 140 can be ex-situ doped, where dopants are incorporated into the source/drain extension contacts 140 and the nanosheet core, for example, by ion implantation, gas phase doping, plasma doping, plasma immersion ion implantation, cluster doping, infusion doping, liquid phase doping, solid phase doping, or any suitable combination of those techniques.

Figure 9:
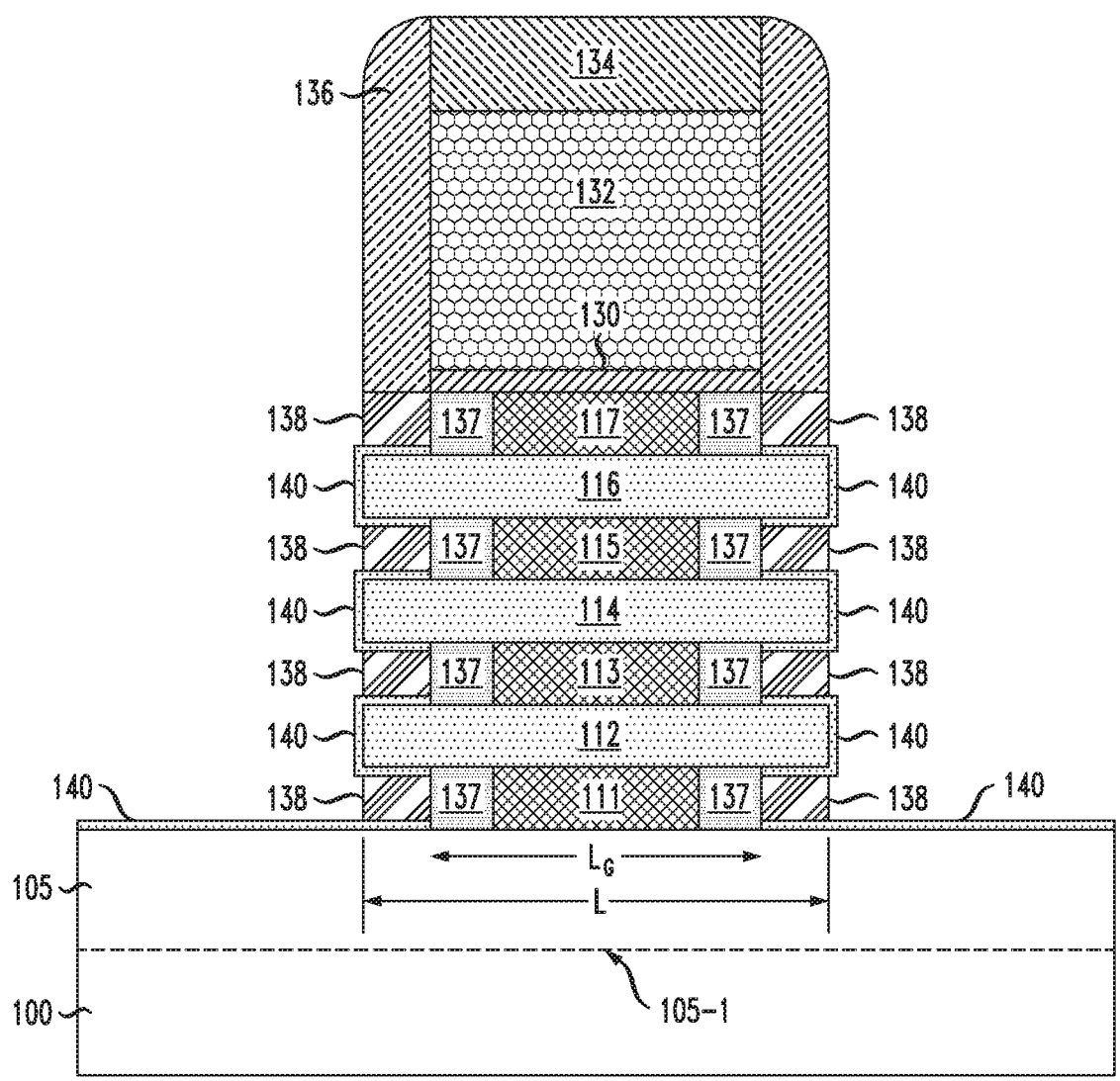

Following formation of the source/drain extension contacts 140, the remaining portions of the recessed regions 110-R are filled with dielectric material to the form the embedded gate sidewall spacers 138. In particular, FIG. 9 is a schematic cross-sectional side view of the semiconductor structure shown in FIG. 8 after forming the embedded gate sidewall spacers 138 adjacent to the sacrificial inner spacers 137 to fill the recessed regions 110-R. In one embodiment, the embedded gate sidewall spacers 138 are formed of the same dielectric material used to form the gate sidewall spacer 136. For example, the embedded gate sidewall spacers 138 can be formed of SiN, SiBCN, SiCO, SiBCN, SiCON, or any other type of dielectric material (e.g., a low-k dielectric material having a k of less than 5, wherein k is the relative dielectric constant.) which is used to form the insulating gate sidewall spacer 136 of the nanosheet FET device.

In one embodiment, the embedded gate sidewall spacers 138 are formed by depositing a conformal layer of dielectric material over the semiconductor structure of FIG. 8 until the recesses 110-R are filled with dielectric material, followed by an etch back to remove the excess dielectric material from the gate structure and the substrate 100. The dielectric material is deposited using a highly conformal deposition process, such as ALD, to ensure that the recesses 110-R are sufficiently filled with dielectric material. The conformal layer of dielectric material can be etched back using an isotropic (wet or dry) etch process to remove the excess dielectric material, while leaving the dielectric material in the recesses 110-R to form the embedded gate insulating spacers 138. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Figure 10:
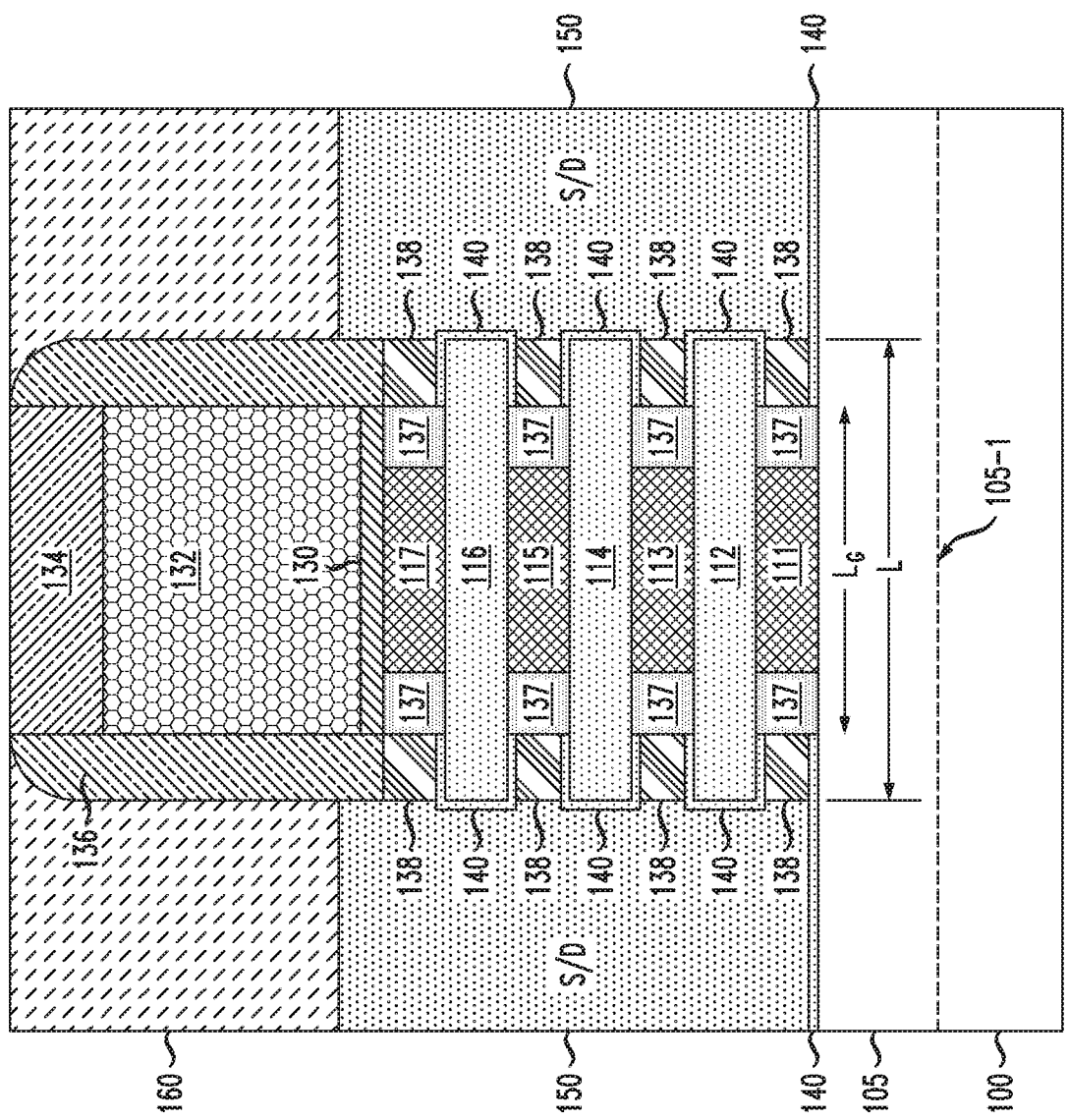

Next, FIG. 10 is a schematic cross-sectional side view of the semiconductor structure shown in FIG. 9 after forming source/drain layers 150 of the nanosheet FET device and forming an insulating layer 160 (e.g., ILD or PMD layer) to cover the nanosheet FET device. The source/drain layers 150 are formed by epitaxially growing semiconductor material (e.g., epitaxial Si material, SiGe material, Si:C material) on the exposed surfaces of the source/drain extension contacts 140 using known techniques such as CVD, MOCVD, LPCVD, MBE, VPE, or other known epitaxial growth techniques which are suitable for the given process flow. In this exemplary embodiment, the exposed surfaces of the source/drain extension contacts 140 provide a larger surface area (as compared to surface area of the sidewall surfaces of the active nanosheet channel layers 112, 114, and 116) to seed the epitaxial growth of the S/D layers 150. The type of epitaxial semiconductor material that is used to form the S/D layers 150 will vary depending on, e.g., the device type (e.g., n-type or p-type) of the nanosheet FET device, etc.

In some embodiments, the epitaxial growth of the semiconductor material on the exposed surfaces of the source/drain extension contacts 140 is performed so that the epitaxial material merges (in the Z-direction) to form the source/drain layers 150. Furthermore, in some embodiments, the source/drain regions 150 are doped using known techniques. For example, in one embodiment, the source/drain layers 150 are "in-situ" doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the epitaxially grown semiconductor material. According to an exemplary embodiment, source layers and drain layers are formed from an in-situ doped (i.e., during growth) epitaxial material such as in-situ doped epitaxial Si, carbon doped silicon (Si:C) and/or SiGe. Suitable n-type dopants include but are not limited to phosphorous (P), arsenic (As). Suitable p-type dopants include but are not limited to boron (B). The use of an in-situ doping process is merely an example. For instance, an ex-situ process may be used to introduce dopants into the source/drain layers. Other doping techniques can be used to incorporate dopants in the source/drain layers. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. Although not specifically shown in FIG. 10, prior to forming the source/drain layers 150, an isolation layer can be formed on or within a recess of the exposed surface of the substrate 100 to provide isolation between the source/drain layers 150 and the substrate 100.

In addition, in some embodiments, a thermal anneal process is performed following the epitaxial growth and doping of the source/drain layers 150 to cause dopants to be injected into the source/drain extension contacts 140 and into portions of the active nanosheet channel layers 112, 114, and 116 that are in contact with the epitaxial semiconductor material of the source/drain extension contacts 140. This anneal process effectively results in extending the source/drain layer 150 into the semiconductor material of the end portions of the active nanosheet channel layers 112, 114, and 116, leading to a further decrease in parasitic resistance of the nanosheet FET device. In other embodiments, the thermal anneal process is performed in a later process (such as after the formation of the high-k gate dielectric layers) so that the same anneal process can serve two purposes at the same time: driving dopants into the nanosheet layers, and improving the reliability of the high-k gate dielectric.

Following the formation of the epitaxial source/drain layers 150, the process flow continues with forming the insulating layer 160 (e.g., ILD layer, or PMD layer) to encapsulate the gate structure and source/drain layers 150 in dielectric/insulating material, prior to commencing a replacement metal gate process. In one embodiment, the insulating layer 160 is formed by depositing a blanket layer of dielectric/insulating material over the semiconductor structure and planarizing the layer of dielectric/insulating material down to the gate capping layer 134 to form the insulating layer 160, as shown schematically shown in FIG. 10.

The insulating layer 160 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material for the insulating layer 160 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layer 134. In some embodiments, the insulating layer 160 comprises a conformal silicon nitride liner that is initially formed on the exposed surfaces of dummy gate structure and S/D layers 50, before blanket depositing an insulating materials such as silicon oxide.

Figure 11A:
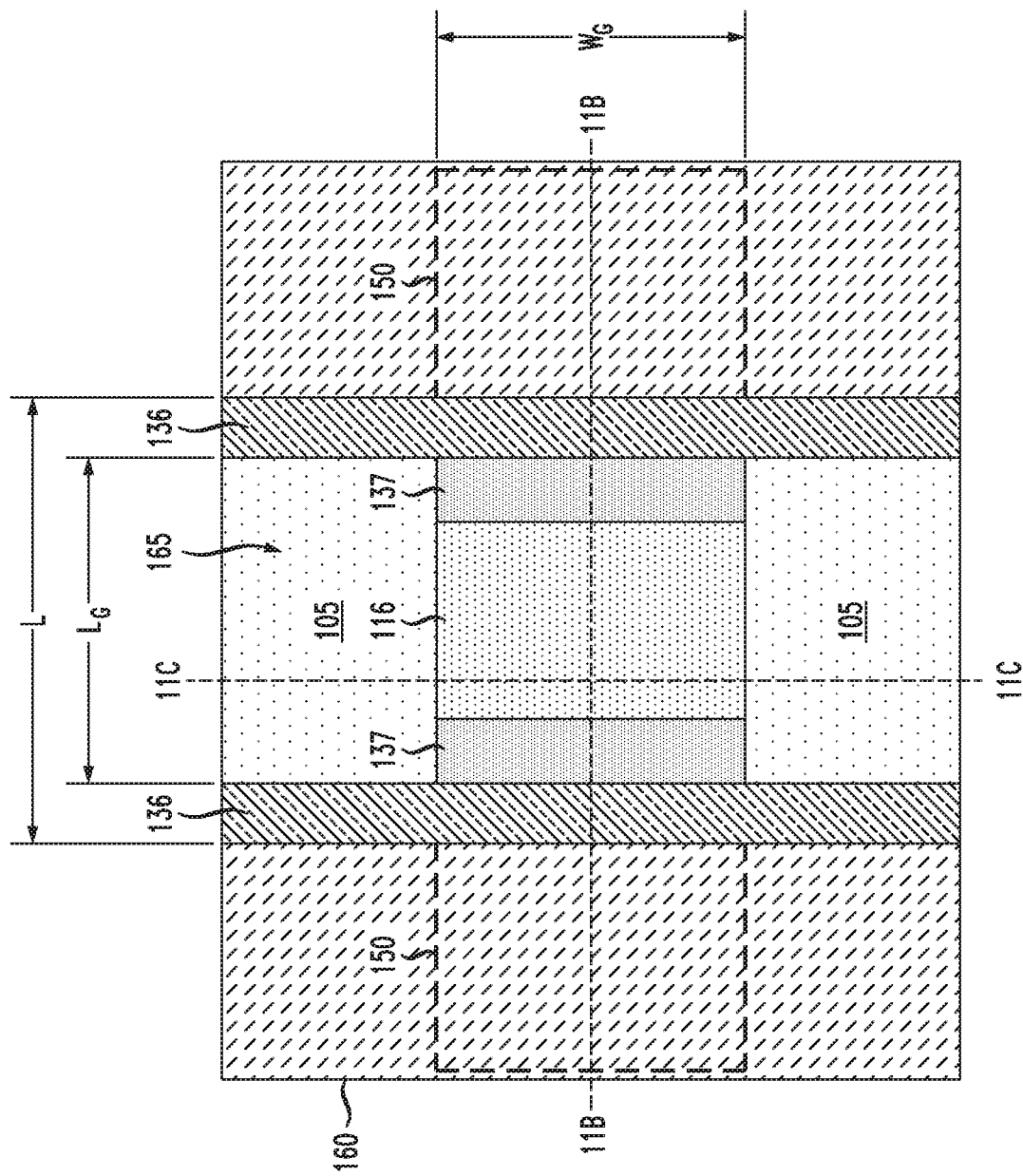
FIG. 11A is a schematic top plan view of the semiconductor structure shown in FIG. 10 after removing a dummy gate capping layer and dummy gate sacrificial layers, and after removing the sacrificial nanosheet layers to release the active nanosheet channel layers of the nanosheet stack structure and form an open gate region.

Following the formation of the insulating layer 160, a replacement metal gate process is performed to replace the sacrificial gate dummy gate materials with a HKMG structure, using a process flow as schematically illustrated in FIGS. 11A through 12B. For example, FIGS. 11A, 11B, and 11C are schematic views of the semiconductor structure shown in FIG. 10 after removing the dummy gate capping layer 134 and the dummy gate sacrificial layers (e.g., the dummy gate oxide layer 130 and the dummy gate electrode layer 132), and after removing the sacrificial nanosheet layers 111, 113, 115, and 117 to release the active nanosheet channel layers 112, 114 and 116 and form an open gate region 165. FIG. 11A is schematic top plan view of the resulting semiconductor structure, FIG. 11B is a schematic cross-sectional side view (Y-Z plane) of the resulting semiconductor structure along line 11B-11B shown in FIG. 11A, and FIG. 11C is a schematic cross-sectional side view (X-Z plane) of the resulting semiconductor structure along line 11C-11C shown in FIG. 11A.

In one embodiment, the dummy gate capping layer 134 can be removed by planarizing (e.g., via CMP) the surface of the semiconductor structure shown in FIG. 10 down to the upper surface of the dummy gate electrode layer 132. In another embodiment, the dielectric material of the dummy gate capping layer 134 (e.g., SiN) can be etched away selective to the materials of the gate sidewall spacer 136 (e.g., SiBCN) and the insulating layer 160 (e.g., silicon oxide) to expose the underlying dummy gate electrode layer 132. The dummy gate electrode layer 132 (e.g., sacrificial polysilicon layer, or amorphous silicon layer) and dummy gate oxide layer 130 are then etched away using known etching techniques and etch chemistries.

For example, the sacrificial dummy gate polysilicon material can be removed using a selective dry etch or wet etch process with suitable etch chemistries, including ammonium hydroxide ($NH_4OH$), tetramethylammonium hydroxide (TMAH), or SF6 plasma. The etching of the dummy poly gate layer is selective to, e.g., the dummy gate oxide layer, to thereby protect the active nanosheet channel layers 112, 114, and 116 from being etched during the poly etch process. After the polysilicon material is removed, an oxide etch process is performed to etch away the dummy gate oxide layer 130 selective to, e.g., the active nanosheet channel layers 112, 114, and 116. In this manner, the sacrificial materials (e.g., dummy polysilicon and oxide layers) of the dummy gate layer 130 can be etched away without damaging the active nanosheet channel layers 112, 114, and 116.

After removing the dummy gate layers 132 and 130, an etch process is performed to selectively etch away the sacrificial nanosheet layers 111, 113, 115, and 117 of the nanosheet stack structure 110-2 to release the active nanosheet channel layers 112, 114, and 116, thereby allowing the open gate region 130-1 to extend into spaces between and adjacent to the active nanosheet channel layers 112, 114, and 116. The sacrificial nanosheet layers 111, 113, 115, and 117 (e.g., SiGe layers) can be etched away selective to the active nanosheet channel layers 112, 114, and 116 (e.g., Si layers) and the sacrificial inner spacers 137 (e.g., SiO2 layer). In one embodiment, the SiGe material of the sacrificial nanosheet layers 111, 113, 115, and 117 can be selectively etched (with high etch selectivity) using a gas phase HCl (hydrochloric acid) or wet etch solution containing hydrogen peroxide (H2O2) to etch the SiGe material of the sacrificial nanosheet layers 111, 113, 115, and 117 selective to the Si material of the active nanosheet channel layers 112, 114, and 116 and the SiO2 material of the sacrificial inner spacers 137. The gas phase HCl (hydrochloric acid) provides high etch selectivity when, for example, the active nanosheet channel layers 112, 114, and 116 are formed of Si or SiGe with a lower Ge concentration than the SiGe material of the sacrificial nanosheet layers 111, 113, 115, and 117.

During the etch process to release the active channel layers 112, 114, and 116, the sacrificial inner spacers 137 serve to protect the source/drain extension contacts 140 from being etched or otherwise damaged by the etch chemistry and environment utilized to etch away the sacrificial nanosheet layers 111, 113, 115, and 117. For example, in instances where the sacrificial nanosheet layers 111, 113, 115, and 117 and the source/drain extension contacts 140 are formed of a similar material such as SiGe, the source/drain extension contacts 140 would be etched during the channel release process if the sacrificial inner spacers 137 were not present. After removing the sacrificial nanosheet layers 111, 113, 115, and 117 of the nanosheet stack structure 110-2 to release the active nanosheet channel layers 112, 114, and 116, another etch process is performed to etch away the sacrificial inner spacers 137 selective to, e.g., the active nanosheet channel layers 112, 114, and 116, and the source/drain extension contacts 140. In particular, in an exemplary embodiment where the sacrificial inner spacers 137 are formed of silicon oxide, the sacrificial inner spacers 137 can be removed using any known oxide etch process which is highly selective to the epitaxial semiconductor materials of the active nanosheet channel layers 112, 114, and 116, and the source/drain extension contacts 140.

Figure 11B:
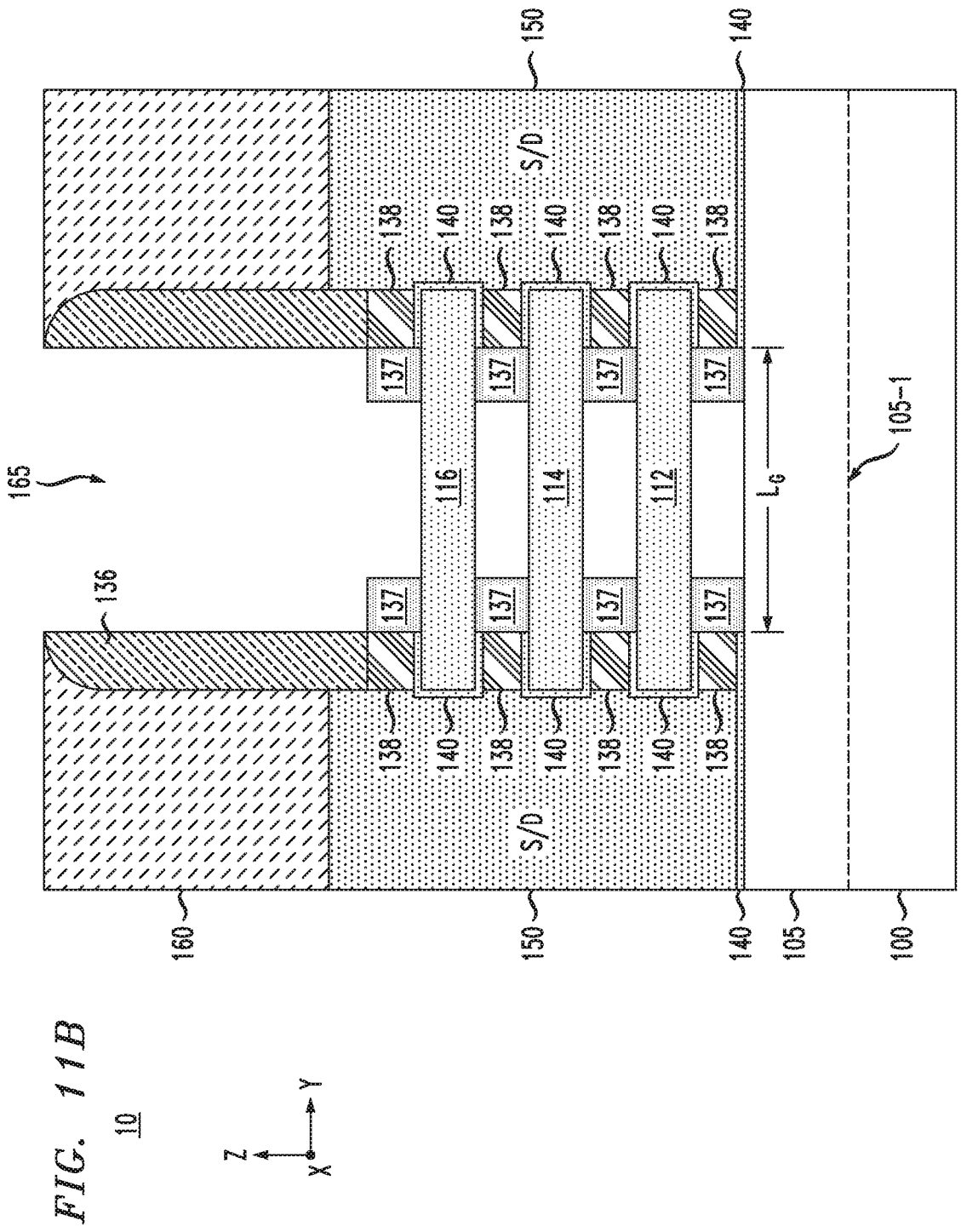
FIG. 11B is a schematic cross-sectional side view of the semiconductor structure along line 11B-11B shown in FIG. 11A.
Figure 11C:
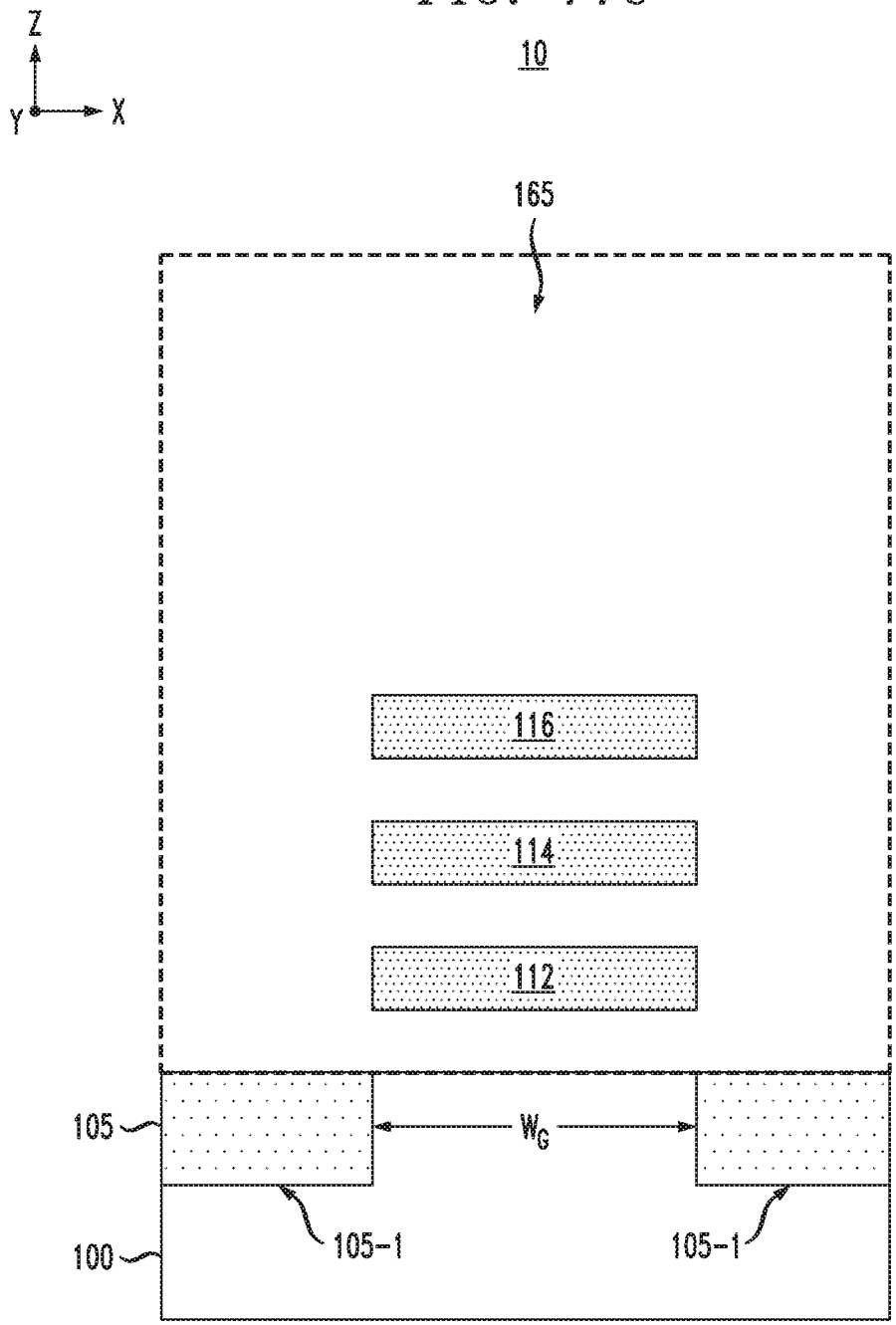
FIG. 11C is a schematic cross-sectional side view of the semiconductor structure along line 11C-11C shown in FIG. 11A.
Figure 12B:
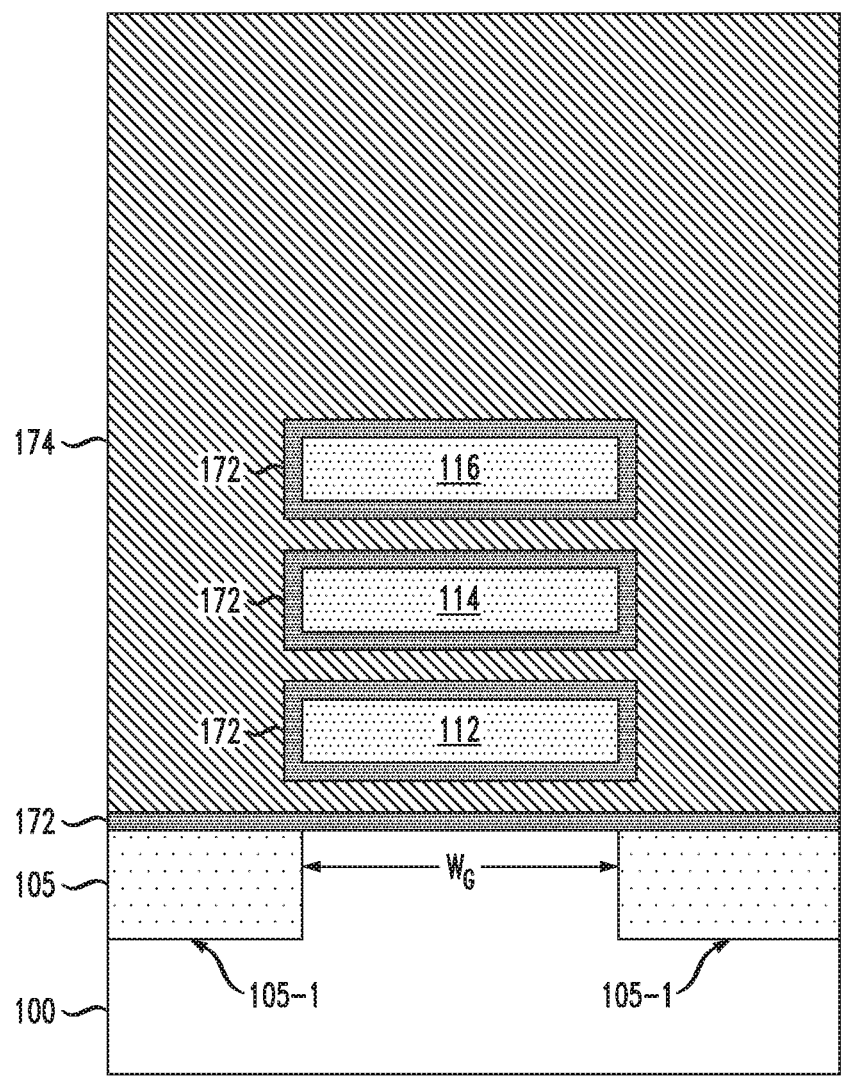

FIGS. 12A and 12B are schematic cross-sectional side views of the semiconductor structure shown in FIGS. 11B and 11C, respectively, after removing the sacrificial inner spacers 137 and forming the HKMG structure 170. FIG. 12B is a schematic cross-sectional side view (X-Z plane) of the resulting semiconductor structure along line 12B-12B shown in FIG. 12A. The HKMG structures 170 comprises a high-k gate dielectric layer 172 and a metal gate layer 174. In one embodiment, the HKMG structure 170 is formed by depositing one or more conformal layers of high-k gate dielectric material over the exposed surfaces of the semiconductor structure to conformally cover the surfaces of the active nanosheet channel layers 112, 114, and 116. The high-k gate dielectric layer 172 is preferably formed of a high-k dielectric material having a dielectric constant of about 3.9 or greater.

For example, the gate dielectric material can include but are not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal high-k gate dielectric layer 172 is formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layer 172, a channel pre-clean process is performed to clean the exposed silicon surfaces of the active nanosheet channel layers 112, 114, and 116, which is then followed by an oxidation process to grow ultra-thin interfacial silicon oxide layers on the exposed surfaces of the active nanosheet channel layers 112, 114, and 116. It is to be understood that the formation of the interfacial silicon oxide layers is an optional step and that in other embodiments of the invention, a high-k dielectric material of the HKMG structures can be formed on the exposed silicon surfaces of the active nanosheet channel layers without initially forming the thin interfacial oxide layers.

In one exemplary embodiment, the interfacial silicon oxide layers are formed using a chemical oxidation process in an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, and 116 to form thin interfacial silicon oxide layers with a thickness in a range of about 5 angstroms to about 10 angstroms (i.e., about 0.5 nm to about 1 nm).

In some embodiments, the metal gate layer 174 comprises one or more work function metal layers which are conformally deposited over the high-k gate dielectric layer 172. The work function metal layer(s) may comprise one or more types of metallic materials, including, but not limited to, titanium nitride (TiN), tantalum nitride (TaN), and an Al-containing alloy (e.g., TiAlC, TiAl, and AlC, or nitrided alloys thereof). In other embodiments, the work function metal layer(s) may comprise a metallic material which comprises a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions which are suitable for the type (e.g., N-type or P-type) of nanosheet FET devices that are to be formed. The work function metal layers are conformally deposited using known methods such as ALD, CVD, etc., which allow for high conformality of the deposited work function metal layers.

In some embodiments, the work function metal layers completely fill the spaces above and below the active nanosheet channel layers 112, 114, and 116. Indeed, in instances where the initial spacing between the active nanosheet channels 112, 114 and 116 is relatively small (e.g., 7 nm to 10 nm), after formation of the high-k dielectric layer 172, the conformal deposition of a stack of two or more work function metal layers can result in filling (i.e., pinch-off) the spaces above and below the active nanosheet channel layers 112, 114, and 116 such that the spaces are filled with gate dielectric material and work function metal. This is sufficient for short-channel length nanosheet FET devices where $L_G$ is about 15 nm or less.

Furthermore, in some embodiments, the remaining portions of the open gate region 165 above the active nanosheet channel layer 116 can be filled with work function metal by continuing the deposition process for the last deposited work function metal layer until the open gate region 165 above the active nanosheet channel layer 116 is completely filled with the work function metal layer. In other embodiments, the remaining portion of the open gate region 165 can be filled with a low-resistance metallic material such as tungsten, ruthenium, cobalt, copper, aluminum, etc. to form a metallic gate electrode apart from the work function metal.

Following the deposition of the dielectric and metallic materials that form the HKMG structure 170, a CMP process is performed to polish the surface of the semiconductor structure down to the ILD layer 160, thereby removing overburden portions of the gate dielectric, work function, and gate electrode layers, resulting in the semiconductor structure shown in FIGS. 12A and 12B. Following formation of HKMG structure 170, any known sequence of processing steps can be performed to complete the fabrication of the semiconductor integrated circuit device, the details of which are not needed to understand embodiments of the invention.

Briefly, following the formation of the HKMG structure 170, an etch process can be performed to recess an upper surface of the HKMG structure 170 down to a target level below the upper surface of the ILD layer 160. A layer of dielectric material is then deposited over the surface of the semiconductor device structure to fill the area above the recessed surfaces of the HKMG structure 170 with dielectric material, and the semiconductor device structure is planarized down to the surface of the ILD layer 160 to remove the overburden dielectric material, and thereby form the gate capping layer 180 (as shown in FIGS. 1A and 1B). The gate capping layer 180 can be formed of a dielectric material such as SiN or SiBCN, etc. Next, middle-of-the-line (MOL) processing can continue to form MOL contacts such as the source/drain contact 190 and gate contacts, etc., using known materials and fabrication techniques. Then, a back-end-of-line (BEOL) process module can be performed to fabricate a BEOL interconnect structure which provides connections to/between the MOL contacts, and other active or passive devices that are formed as part of the front-end-of-line (FEOL) layer.

In some embodiments, the vertical source/drain contacts 190 shown in FIG. 1A comprise trench silicide (TS) contacts which are formed using known methods. For example, the TS contacts 190 are formed by a process which comprises etching a contact opening in the insulating layer 160 to expose the S/D layers 150, forming stack of layers in the contact openings over the S/D layers 150, wherein the stack of layers comprises an epitaxial contact layer formed on the S/D layer 150, a metallic contact liner layer formed on the epitaxial contact layers, and a metallic fill layer formed over the metallic contact liner layers. A thermal anneal process is then performed to induce a reaction between the epitaxial contact layers and the metallic contact liner layers to form silicide contact layers on the S/D layers 150, thereby forming the vertical TS source/drain contacts 190.

It is to be understood that the exemplary methods discussed herein for fabricating gate-all-around FET devices with source/drain extension contacts for reduced parasitic resistance a can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:

forming a field-effect transistor device on a semiconductor substrate, wherein the field-effect transistor device comprises: (i) a nanosheet stack structure comprising a stack of alternating semiconductor layers comprising a plurality of sacrificial nanosheet layers and a plurality of active nanosheet channel layers, wherein each active nanosheet channel layer is disposed between sacrificial nanosheet layers in the nanosheet stack structure; (ii) a dummy gate structure covering the nanosheet stack structure to define a gate region; and (iii) a gate sidewall spacer disposed on sidewalls of the dummy gate structure;

laterally recessing exposed sidewall surfaces of the sacrificial nanosheet layers to form recessed regions within the sidewalls of the nanosheet stack structure, wherein the lateral recessing is performed by etching the sacrificial nanosheet layers selective to the active nanosheet channel layers;

forming source/drain extension contacts on exposed end portions of the active nanosheet channel layers, wherein the source/drain extension contacts are formed on exposed surfaces of the active nanosheet channel layers within the recessed regions and on exposed sidewall surfaces of the active nanosheet channel layers;

filling a remaining portion of the recessed regions with dielectric material to form embedded gate sidewall spacers; and forming source/drain layers in contact with the source/drain extension contacts;

wherein forming the source/drain extension contacts on the exposed end portions of the active nanosheet channel layers comprises performing a first epitaxial deposition process to epitaxially grow the source/drain extension contacts on the exposed surfaces of the active nanosheet channel layers within the recessed regions and on the exposed sidewall surfaces of the active nanosheet channel layers; and wherein the active nanosheet channel layers are formed of a first epitaxial semiconductor material and wherein the source/drain extension contacts are formed of a second epitaxial semiconductor material.

2. The method of claim 1, wherein the formation of the source/drain extension contacts within the recessed regions is confined to prevent the source/drain extension contacts from being formed on portions of the active nanosheet channel layers overlapped by the dummy gate structure, which define a gate length of the field-effect transistor device.

3. The method of claim 1, wherein forming the source/drain layers in contact with the source/drain extension contacts comprises performing a second epitaxial deposition process to epitaxially grow the source/drain layers starting on exposed surfaces of source/drain extension contacts.

4. The method of claim 1, wherein the first and second epitaxial semiconductor materials are the same.

5. The method of claim 4, wherein the first and second epitaxial semiconductor materials comprise crystalline silicon.

6. The method of claim 1, wherein the first and second epitaxial semiconductor materials are different.

7. The method of claim 6, wherein first epitaxial semiconductor material comprises crystalline silicon and wherein the second epitaxial semiconductor material comprises one of carbon doped silicon and a silicon germanium alloy.

8. The method of claim 1, further comprising:
removing the dummy gate structure to open the gate region and expose the nanosheet stack structure within the gate region;
removing the sacrificial nanosheet layers exposed in the gate region to release the active nanosheet channel layers and form spaces between the active nanosheet channel layers; and
forming a high-k dielectric/metal gate structure within the gate region to surround the active nanosheet channel layers;
wherein the portions of the active nanosheet channel layers surrounded by the high-k dielectric/metal gate structure define the gate length of the field-effect transistor device; and
wherein the source/drain extension contacts are disposed between the embedded gate sidewall spacers and the active nanosheet channel layers, and extend from source/drain layers to the high-k dielectric/metal gate structure.

9. The method of claim 1, wherein the exposed sidewall surfaces of the sacrificial nanosheet layers are recessed to a recess depth which exposes portions of the active nanosheet channel layers overlapped by the dummy gate structure, which define a gate length of the field-effect transistor device, wherein the method further comprises:
forming sacrificial inner spacers within the recessed regions to cover the exposed portions of the active nanosheet channel layers that define the gate length of the field-effect transistor device; and
forming the source/drain extension contacts on the end portions of the active nanosheet channel layers after forming the sacrificial inner spacers within the recessed regions;
wherein the sacrificial inner spacers prevent the source/drain extension contacts from being formed on the portions of the active nanosheet channel layers that define the gate length of the field-effect transistor device.

10. The method of claim 9, wherein the sacrificial inner spacers are formed of a material that has an etch selectivity with respect to materials of the sacrificial nanosheet layers, the active nanosheet channel layers, and the embedded gate sidewall spacers.

11. A method for fabricating a semiconductor device, comprising:
forming a field-effect transistor device on a semiconductor substrate, wherein the field-effect transistor device comprises: (i) a nanosheet stack structure comprising a stack of alternating semiconductor layers comprising a plurality of sacrificial nanosheet layers and a plurality of active nanosheet channel layers, wherein each active nanosheet channel layer is disposed between sacrificial nanosheet layers in the nanosheet stack structure; (ii) a dummy gate structure covering the nanosheet stack structure to define a gate region; and (iii) a gate sidewall spacer disposed on sidewalls of the dummy gate structure;
laterally recessing exposed sidewall surfaces of the sacrificial nanosheet layers to form recessed regions within the sidewalls of the nanosheet stack structure, wherein the lateral recessing is performed by etching the sacrificial nanosheet layers selective to the active nanosheet channel layers;
forming source/drain extension contacts on exposed end portions of the active nanosheet channel layers, wherein the source/drain extension contacts are formed on exposed surfaces of the active nanosheet channel layers within the recessed regions and on exposed sidewall surfaces of the active nanosheet channel layers;
filling a remaining portion of the recessed regions with dielectric material to form embedded gate sidewall spacers; and
forming source/drain layers in contact with the source/drain extension contacts;
wherein the exposed sidewall surfaces of the sacrificial nanosheet layers are recessed to a recess depth which exposes portions of the active nanosheet channel layers overlapped by the dummy gate structure, which define a gate length of the field-effect transistor device, wherein the method further comprises:
forming sacrificial inner spacers within the recessed regions to cover the exposed portions of the active nanosheet channel layers that define the gate length of the field-effect transistor device; and
forming the source/drain extension contacts on the end portions of the active nanosheet channel layers after forming the sacrificial inner spacers within the recessed regions;
wherein the sacrificial inner spacers prevent the source/drain extension contacts from being formed on the portions of the active nanosheet channel layers that define the gate length of the field-effect transistor device.

12. The method of claim 11, wherein the sacrificial inner spacers are formed of a material that has an etch selectivity with respect to materials of the sacrificial nanosheet layers, the active nanosheet channel layers, and the embedded gate sidewall spacers.

13. The method of claim 12, wherein the sacrificial inner spacers are formed of silicon oxide.

14. A method for fabricating a semiconductor device, comprising:
forming a field-effect transistor device on a semiconductor substrate, wherein the field-effect transistor device comprises: (i) a nanosheet stack structure comprising a stack of alternating semiconductor layers comprising a plurality of sacrificial nanosheet layers and a plurality of active nanosheet channel layers, wherein each active nanosheet channel layer is disposed between sacrificial nanosheet layers in the nanosheet stack structure; (ii) a dummy gate structure covering the nanosheet stack structure to define a gate region; and (iii) a gate sidewall spacer disposed on sidewalls of the dummy gate structure;

laterally recessing exposed sidewall surfaces of the sacrificial nanosheet layers to form recessed regions within the sidewalls of the nanosheet stack structure, wherein the lateral recessing is performed by etching the sacrificial nanosheet layers selective to the active nanosheet channel layers, wherein the recessed regions have a recess depth which exposes portions of the active nanosheet channel layers overlapped by the dummy gate structure, which define a gate length of the field-effect transistor device;

forming sacrificial inner spacers within the recessed regions to cover the exposed portions of the active nanosheet channel layers that define the gate length of the field-effect transistor device;

forming epitaxial source/drain extension contacts on exposed end portions of the active nanosheet channel layers, wherein the source/drain extension contacts are formed on exposed surfaces of the active nanosheet channel layers within the recessed regions and on exposed sidewall surfaces of the active nanosheet channel layers;

filling a remaining portion of the recessed regions with dielectric material to form embedded gate sidewall spacers which are disposed adjacent to the sacrificial inner spacers;

forming epitaxial source/drain layers in contact with the epitaxial source/drain extension contacts;

selectively removing the dummy gate structure to open the gate region and expose the nanosheet stack structure and the sacrificial inner spacers within the gate region;

selectively removing the sacrificial nanosheet layers exposed in the gate region to release the active nanosheet channel layers and form spaces between the active nanosheet channel layers;

selectively removing the sacrificial inner spacers within the spaces between the active channel layers, wherein the sacrificial inner spacers are formed of a material that has an etch selectivity with respect to materials of the sacrificial nanosheet layers, the active nanosheet channel layers, the embedded gate sidewall spacers, and the source/drain extension contacts; and forming a high-k dielectric/metal gate structure within the gate region to surround the active nanosheet channel layers;

wherein the source/drain extension contacts are disposed between the embedded gate sidewall spacers and the active nanosheet channel layers, and extend from source/drain layers to the high-k dielectric/metal gate structure.

15. The method of claim 14, wherein the active nanosheet channel layers are formed of a first epitaxial semiconductor material and wherein the source/drain extension contacts are formed of a second epitaxial material, wherein the first and second epitaxial semiconductor materials are the same.

16. The method of claim 15, wherein the first and second epitaxial semiconductor materials comprise crystalline silicon.

17. The method of claim 14, wherein the active nanosheet channel layers are formed of a first epitaxial semiconductor material and wherein the source/drain extension contacts are formed of a second epitaxial material, wherein the first and second epitaxial semiconductor materials are different.

18. The method of claim 17, wherein first epitaxial semiconductor material comprises crystalline silicon and wherein the second epitaxial semiconductor material comprises one of carbon doped silicon and a silicon germanium alloy.

19. The method of claim 14, wherein the sacrificial inner spacers are formed of silicon oxide.

* * * * *